United States Patent
Mancosu et al.

(10) Patent No.: US 6,761,060 B2
(45) Date of Patent: Jul. 13, 2004

(54) TIRE HAVING A MODEL-BASED DESCRIPTION ENABLING DETERMINATION OF ROAD HANDLING CHARACTERISTICS

(75) Inventors: Federico Mancosu, Milan (IT); Roberto Sangalli, Brugherio (IT)

(73) Assignee: Pirelli Pneumatici S.p.A., Milan (IT)

( * ) Notice: Subject to any disclaimer, the term of this patent is extended or adjusted under 35 U.S.C. 154(b) by 153 days.

(21) Appl. No.: 09/842,409

(22) Filed: Apr. 26, 2001

(65) Prior Publication Data

US 2001/0020386 A1 Sep. 13, 2001

Related U.S. Application Data

(62) Division of application No. 09/286,671, filed on Apr. 6, 1999
(60) Provisional application No. 60/092,594, filed on Jul. 10, 1998.

(30) Foreign Application Priority Data

Apr. 7, 1998 (EP) ............................................. 98830209

(51) Int. Cl.⁷ ............................................ G01M 17/02
(52) U.S. Cl. .................................................. 73/146
(58) Field of Search ............................ 73/146; 152/548

(56) References Cited

U.S. PATENT DOCUMENTS 5,691,477 A * 11/1997 Di Bernardo et al. ......... 73/662
5,777,220 A * 7/1998 Matrascia et al. ............. 73/146
5,811,672 A * 9/1998 Mancosu et al. ............. 73/146
5,817,935 A   10/1998 Di Bernardo et al.
5,853,509 A * 12/1998 Boiocchi et al. ............. 152/450
6,338,270 B1 * 1/2002 Mancosu et al. ............. 73/146

FOREIGN PATENT DOCUMENTS

| EP | 0 647 911 | 4/1995 |
| EP | 0 775 902 | 5/1997 |

* cited by examiner

*Primary Examiner*—Edward Lefkowitz
*Assistant Examiner*—Andre Allen
(74) *Attorney, Agent, or Firm*—Finnegan, Henderson, Farabow, Garrett & Dunner, L.L.P.

(57) ABSTRACT

A tire for a wheel of a vehicle includes selected mixes of rubber and reinforcing materials, a carcass, a belting structure, a tread band provided with inserts, shoulders, sidewalls, and beads provided with bead wires and bead fillings. The tire is further represented by a concentrated-parameter physical model including a brush model with a road, where concentrated parameters of the physical model include structural stiffness $K_c$ consisting of lateral stiffness $K_{cy}$, camber torsional stiffness $K_{c\theta x}$ and yawing torsional stiffness $K_{c\theta z}$. The tire is further represented by a finite-element model including first and second elements and has construction characteristics substantially equivalent to the concentrated parameters that describe the dynamic behavior of the tire and enable the determination of selected physical quantities suitable for indicating the drift behavior of the tire for evaluation of the tire in relation to its road handling.

4 Claims, 26 Drawing Sheets

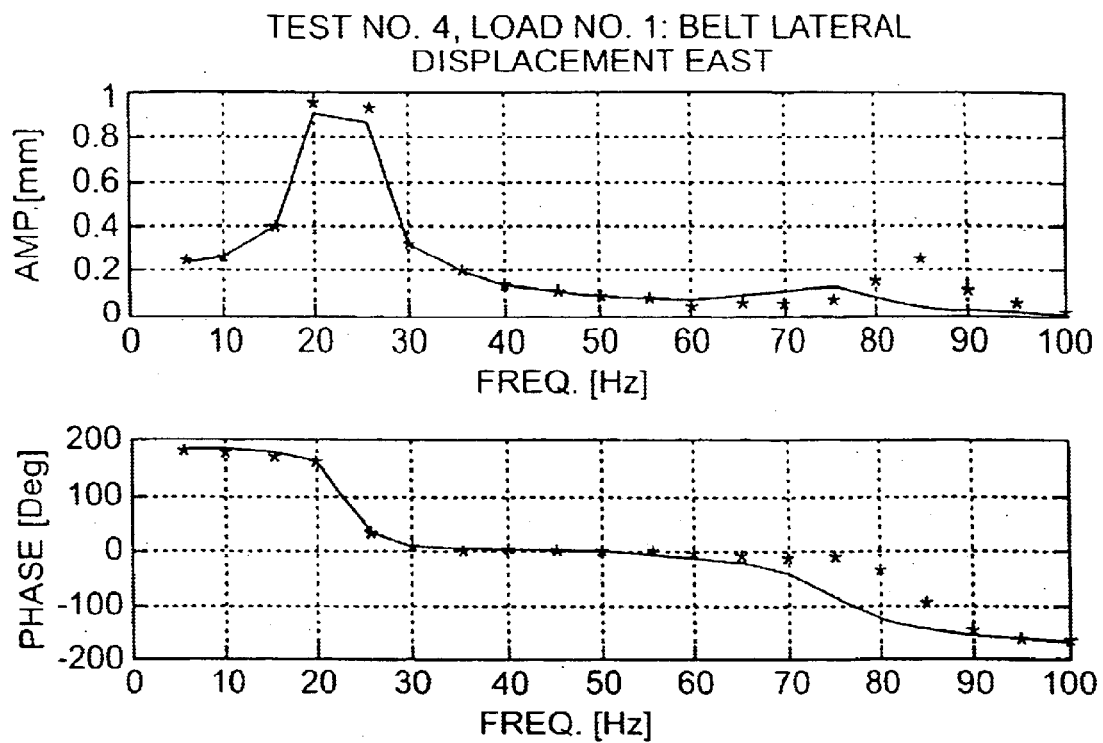
FIG. 15
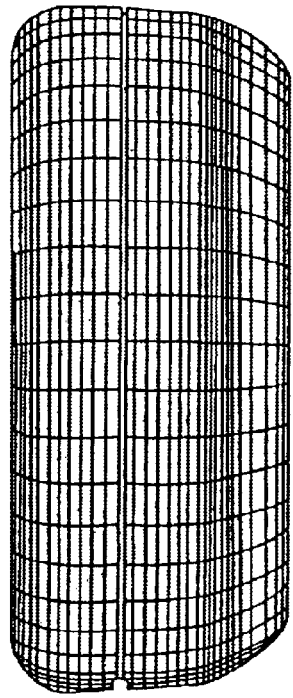 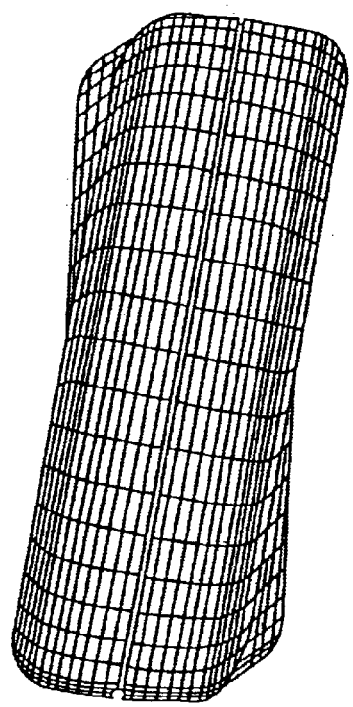
FIG. 16  FIG. 17

TIRE HAVING A MODEL-BASED DESCRIPTION ENABLING DETERMINATION OF ROAD HANDLING CHARACTERISTICS

This is a division of application Ser. No. 09/286,671, filed Apr. 6, 1999, and claims the benefit of U.S. provisional application no. 60/092,594, filed Jul. 10, 1998, both of which are incorporated herein by reference.

This application is based on European Patent Application No. 98830209.7 filed on Apr. 7, 1998 and U.S. Provisional Application No. 60/092,594 filed on Jul. 10, 1998, the content of which is incorporated hereinto by reference.

BACKGROUND OF THE INVENTION

This invention relates to a method for determining the road handling of a tyre of a wheel for a vehicle.

At the present time, to determine the road handling performance of a tyre, the manufacturers of pneumatic tyres are obliged to produce numerous physical prototypes in order to experimentally evaluate the effects of the various design parameters on the drift behaviour of the tyre, under steady state and transient state conditions. The experimental tests are conducted according to iterative procedures, that are largely empirical and based on experience and are also extremely demanding in terms of time and cost.

Furthermore, automobile manufacturing companies are insisting more and more frequently that the makers of pneumatic tyres come up with tyres with extremely precise technical characteristics as early as the initial stages of vehicle study and dynamic behaviour forecasting.

In such a position, the tyre manufacturers are finding it very difficult to respond satisfactorily and with the necessary flexibility to the various market demands.

SUMMARY OF THE INVENTION

The object of this invention is to provide a scientific methodology with which to identify the performance characteristics of a tyre in relation to road handling, on the basis of previously defined design specifications.

The above object is achieved according to this invention by a method for determining the road handling of a tyre of a wheel for a vehicle, said tyre being made from selected mixes of rubber and reinforcing materials, said method comprising:

a) a first description of said tyre by means of a first, concentrated-parameter, physical model, said first physical model comprising a rigid ring which represents the tread band provided with inserts, a belting structure and corresponding carcass portion of said tyre, a disk which represents a hub of said wheel and beading of said tyre, principal springs and dampers connecting said rigid ring to said hub and representing sidewalls of said tyre and air under pressure inside said tyre, supplementary springs and dampers representing deformation phenomena of said belting structure through the effect of a specified vertical load, and a brush model simulating physical phenomena in an area of contact between said tyre and a road, said area of contact having a dynamic length $2a$, b) a definition of selected degrees of freedom of said first physical model, and c) an identification of equations of motion suitable for describing the motion of said first physical model under selected dynamic conditions, characterized in that it comprises d) the definition of said concentrated parameters, said concentrated parameters consisting of the mass $M_c$ and a diametral moment of inertia $J_c$ of said rigid ring, the mass $M_m$ and a diametral moment of inertia $J_m$ of said disk, structural stiffnesses $K_c$ and structural dampings $R_c$ respectively of said principal springs and dampers, and residual stiffnesses $K_r$ and residual dampings $R_r$ respectively of said supplementary springs and dampers, wherein said structural stiffnesses $K_c$ consist of lateral stiffness $K_{cy}$ between said hub and said belt, camber torsional stiffness $K_{c\theta x}$ between said hub and said belt and yawing torsional stiffness $K_{c\theta z}$ between said hub and said belt, said structural dampings $R_c$ consist of lateral damping $R_{cy}$ between said hub and said belt, camber torsional damping $R_{c\theta x}$ between said hub and said belt and yawing torsional damping $R_{c\theta z}$ between said hub and said belt, said residual stiffnesses $K_r$ consist of residual lateral stiffness $K_{ry}$, residual camber torsional stiffness $K_{r\theta x}$ and residual yawing torsional stiffness $K_{r\theta z}$, and said residual dampings $R_r$ consist of residual lateral damping $R_{ry}$, residual camber torsional damping $R_{r\theta x}$ and residual yawing torsional damping $R_{r\theta z}$, e) a description of said tyre by means of a second, finite-element model comprising first elements with a selected number of nodes, suitable for describing said mixes, and second elements suitable for describing said reinforcing materials, each first finite element being associated with a first stiffness matrix which is determined by means of a selected characterization of said mixes and each second element being associated with a second supplementary stiffness matrix which is determined by means of a selected characterization of said reinforcing materials, f) a simulation on said second, finite-element model of a selected series of virtual dynamic tests for exciting said second model according to selected procedures and obtaining transfer functions and first frequency responses of selected quantities, measured at selected points of said second model, g) a description of the behaviour of said first physical model by means of equations of motion suitable for representing the above dynamic tests for obtaining second frequency responses of said selected quantities, measured at selected points of said first physical model, h) a comparison between said first and said second frequency responses of said selected quantities to determine errors that are a function of said concentrated parameters of said first physical model, and i) the identification of values for said concentrated parameters that minimize said errors so that said concentrated parameters describe the dynamic behaviour of said tyre, j) the determination of selected physical quantities suitable for indicating the drift behaviour of said tyre, and k) the evaluation of the drift behaviour of said tyre by means of said physical quantities.

To advantage, said selected physical quantities are the total drift stiffness $K_d$ of said tyre, in turn comprising the structural stiffness $K_c$ and the tread stiffness $K_b$, and the total camber stiffness $K_\gamma$ of said tyre.

According to a preferred embodiment, said method also comprises 1) a definition of said brush model, said brush model having a stiffness per unit of length $c_{py}$ and comprising at least one rigid plate, at least one deformable beam having a length equal to the length 2a of said area of contact and at least one microinsert associated with said beam, said microinsert consisting of at least one set of springs distributed over the entire length of said beam, said springs reproducing the uniformly distributed, lateral and torsional stiffness of said area of contact.

Preferably, said degrees of freedom referred to at previous point b) are composed of:

absolute lateral displacement $y_m$ of said hub, absolute yaw rotation $\sigma_m$ of said hub and absolute rolling rotation $\rho_m$ of said hub, relative lateral displacement $y_c$ of said belt with respect to said hub, relative yaw rotation $\sigma_c$ of said belt with respect to said hub and relative rolling rotation $\rho_c$ of said belt with respect to said hub, absolute lateral displacement $y_b$ of said plate, absolute yaw rotation $\sigma_b$ of said plate and absolute rolling rotation $\rho_b$ of said plate, and absolute lateral displacement $y_s$ of the bottom ends of said at least one microinsert.

According to another embodiment, said selected series of virtual dynamic tests referred to at previous point f) comprises a first and a second test with said tyre blown up and not pressed to the ground, said first test consisting in imposing a translation in the transverse direction y on the hub and in measuring the lateral displacement $y_c$ of at least one selected cardinal point of said belt and the force created between said hub and said belt in order to identify said mass $M_c$, said lateral stiffness $K_{cy}$, and said lateral damping $R_{cy}$, said second test consisting in imposing a camber rotation $\theta_x$ on said hub and in measuring the lateral displacement of at least one selected cardinal point of said belt $y_c$ and the torque transmitted between said hub and said belt in order to identify said diametral moment of inertia $J_c$, said camber torsional stiffness $K_{c\theta x}$, said camber torsional damping $R_{c\theta x}$, said yawing torsional stiffness $K_{c\theta z}$ and said yawing torsional damping $R_{c\theta z}$.

Preferably said selected series of virtual dynamic tests referred to at previous point f) also comprises a third and a fourth test with said tyre blown up, pressed to the ground and bereft of said tread at least in said area of contact, said third test consisting in applying to said hub a sideward force in the transverse direction $F_y$ and in measuring the lateral displacement $y_c$ of said hub and of at least two selected cardinal points of said belt in order to identify said residual lateral stiffness $K_{ry}$, said residual lateral damping $R_{ry}$, said camber residual stiffness $K_{r\theta x}$, and said camber residual damping $R_{r\theta x}$, said fourth test consisting in applying to said hub a yawing torque $C_{\theta z}$ and in measuring the yaw rotation of said hub $\sigma_m$ and the lateral displacement $y_c$ of at least one selected cardinal point of said belt in order to identify said residual yawing stiffness $K_{r\theta z}$ and said residual yawing damping $R_{r\theta z}$.

According to another embodiment, said method also comprises m) an application to said first physical model of a drift angle $\alpha$, starting from a condition in which said at least one beam is in a non-deformed configuration and said brush model has a null snaking $\sigma_b$, n) the determination of the sideward force and the self-aligning torque that act on said hub through the effect of said drift $\alpha$ and which depend on the difference $\alpha - \sigma_b$ and on the deformation of said at least one beam, o) the determination of the deformation curve of said at least one beam, p) an application of said sideward force and said self-aligning torque to said second, finite-element model in order to obtain a pressure distribution on said area of contact and q) the determination of the sideward force and the self-aligning torque that act on said hub through the effect of said drift on said first physical model, that depend on the pressure distribution calculated in the previous step p), r) a check, by means of said pressure distribution obtained in the previous step p), that said sideward force and said self-aligning torque are substantially similar to those calculated in previous step q), s) a determination of the sideward force and of the self-aligning torque for said angle of drift, and t) repetition of the procedure from step m) to step s) for different values of the drift angle $\alpha$ to obtain drift, force and self-alignment torque curves, suitable for indicating the drift behaviour under steady state conditions of said tyre, and u) the evaluation of the steady state drift behaviour of said tyre.

According to another preferred embodiment, said method also comprises:

i) a simulation of the behaviour of said first physical model in the drift transient state by means of equations of motion reproducing selected experimental drift tests, and ii) the determination, with a selected input of a steering angle imposed on said hub, of the pattern with time of the selected free degrees of freedom of said first physical model, of the sideward force and of the self-aligning torque in said area of contact in order to determine the length of relaxation of said tyre.

To advantage, said first elements of said second, finite-element model have linear form functions and their stiffness matrix is determined by means of selected static and dynamic tests conducted on specimens of said mixes, whereas the stiffness matrix of said second elements is determined by means of selected static tests on specimens of said reinforcing materials.

With the method according to this invention, three main results are obtained:

1. determination of the links between physical parameters of the tyre and its structural properties;
2. determination of the steady state drift behaviour of the tyre, without the need to build prototypes at this stage;
3. determination of the transient state behaviour of the tyre, when a generic law of motion is imposed on the hub, without the need to build prototypes at this stage.

These results have been achieved by the production of a very simple, first physical model, with only nine degrees of freedom, that manages to make allowance for the majority of the structural characteristics of the actual tyre.

The structural characteristics of the tyre are reproduced in the first physical model by means of an appropriate condensation of concentrated equivalent masses, stiffnesses and dampings.

In practice, the concentrated-parameter model is equivalent to a kind of dynamic concentration of the complex finite-element model, summarizing all its dynamic characteristics in a low number of mass, damping and stiffness parameters.

More specifically, it has been proven that this correspondence may be held valid in the range of frequencies between 0 and 80 Hz.

The method enables identification of the structural parameters needed for the complete description of the first physical model using simulated virtual numerical tests with a second, extremely detailed model built from finite element models (F.E.M.) reproducing the behaviour of the non-rolling tyre (not drifting).

One of the major advantages of the method according to the invention is that it partly dispenses with the need to construct physical prototypes and the resultant experimental tests in the iterative process of tyre determination, replacing this approach with virtual prototyping.

The tyre's design parameters (characteristics of the mixes, inclination of the threads, shape of the sidewalls, width of the belt, etc.) are directly fed into the second, finite-element model which is extremely detailed.

The concentrated parameters of the first physical model are identified by minimizing the difference between the vibrational dynamic behaviour of the second, finite-element model of the non-rolling tyre and the corresponding response given by the first physical model.

The identification procedure defined comprises various operations that are executed in a precise, pre-established order. Starting from the transfer functions obtained by means of a series of virtual dynamic tests conducted on the non-rolling finite-element model, the masses, stiffnesses and dampings of the concentrated-parameter model are determined, providing a better description of the dynamic behaviour of the tyre.

Thus the identification procedure enables a link to be established between the design parameters (fed into the second finite-element model) and the condensed structural properties (contained in the first model with nine degrees of freedom), which is extremely useful in the construction of a tyre.

The method consists in linking the design parameters of the tyre, characteristics such as the mixture and the belt, to the structural parameters, for instance the structural stiffness and camber stiffness of the tyre, because the quantities appearing in the model used have a physical significance. This means that these quantities are directly linked to the design parameters, in other words the model used is a physical model. By so doing, any change to the design parameters of the tyre leads to a change of the parameters of the predictive physical model of the tyre and this change, in turn, produces a variation of the tyre's structural parameters.

The model permits identification of the structural parameters starting from dynamic analysis made on the second, finite-element model of the non-rolling tyre. One requirement of the concentrated-parameter model is, in fact, that it be predictive of actual behaviour of the tyre.

One of the main advantages of the method according to the invention is that the concentrated parameters are not identified by means of experimental tests on prototypes, but by means of virtual dynamic tests on the finite-element model of the non-rolling tyre.

The method according to the invention uses a model of contact between tyre and road that enables forecasting of the drift curves at steady state. Also fed into the brush model, in addition to the longitudinal and transversal stiffness of the inserts of the tread, was their torsional stiffness, these stiffnesses being identified by means of numerical simulations on the second finite-element model, without any need for experimental tests.

The method according to the invention enables drift curves to be determined by applying a drift angle α to the first physical model;
    created in the area of contact on account of the drift are
        a sideward force and a self-aligning torque that act on the first physical model as forces acting on the hub and cause a lateral displacement and a snaking motion of the plate of the brush model;

because of the snaking motion $\sigma_b$ and the lateral displacement of the plate, the forces set up in the contact area are modified; this results in a variation of the unconstrained degrees of freedom, among which those of the plate, and therefore of the forces acting of the first physical model.

With this procedure, after a certain number of iterations, a point is reached at which the degrees of freedom of the first physical model settle about a steady state value. In this situation, the sideward force and the self-aligning torque created in the area of contact and from which the drift curves may be obtained are determined.

The method according to the invention also enables transient state drift behaviour of the tyre to be evaluated, making allowance in the brush model for the dynamic deformations undergone by the inserts of the tread in this stage.

In this way, the length of relaxation of the tyre while drifting is determined upon variation of the running conditions (speed, vertical load, drift angle, etc.). This procedure is also implemented without any need for experimental testing.

BRIEF DESCRIPTION OF THE FIGURES

Characteristics and advantages of the invention will now be described with reference to an embodiment of the invention, illustrated indicatively and by no means exclusively in the accompanying drawings, where:

FIGS. 7–15 are graphs showing the results of the tests illustrated in the FIGS. 3–6, obtained from the finite-element model of FIG. 2 which describes a selected real tyre;

FIGS. 16–21 depict modes of vibration of the finite-element model describing the selected real tyre;

DETAILED DESCRIPTION OF THE INVENTION

Figure 1:
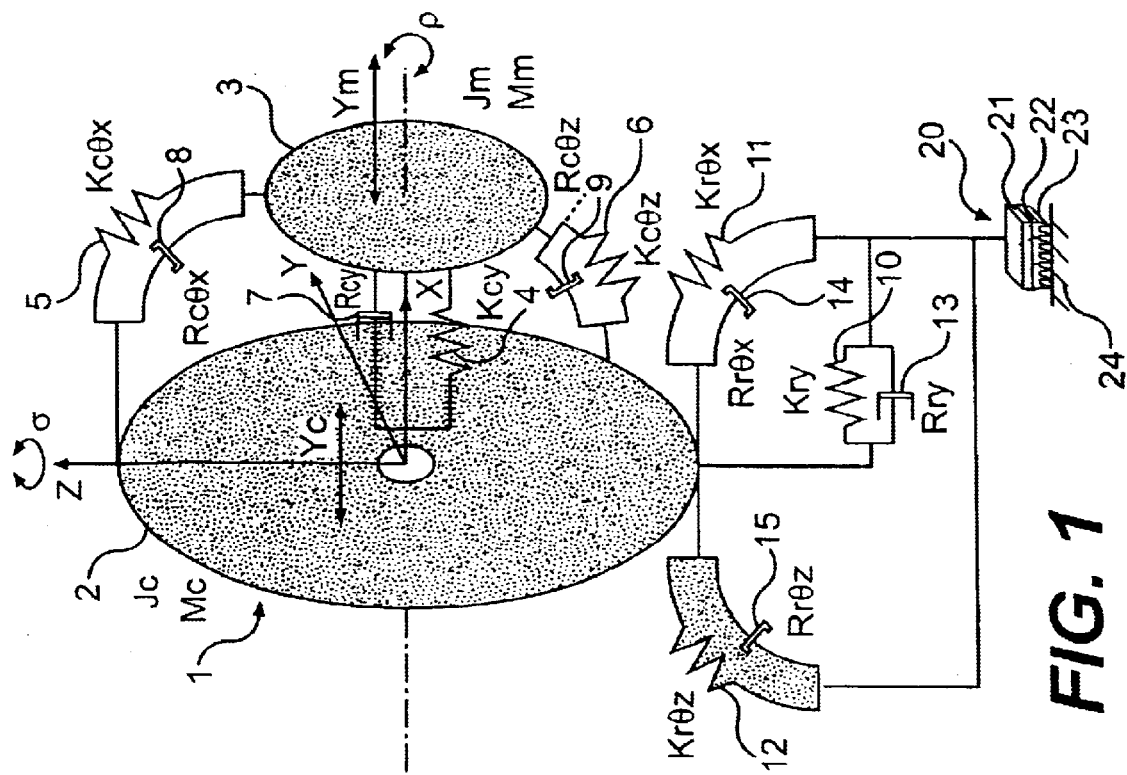
FIG. 1 shows a concentrated-parameter physical model of a tyre used in a method for determining the road handling of a tyre of a wheel for a vehicle, constructed according to the invention.

Illustrated in FIG. 1 is a concentrated-parameter physical model, indicated generically with the numeral 1, reproducing the drift behaviour of a tyre of a wheel, made from selected mixes of rubber and reinforcing materials.

The physical model 1 comprises a rigid ring 2 which represents a tread band provided with inserts, a belting structure and corresponding carcass portion of the tyre, and a rigid disk 3 representing a hub of the wheel and beading of the tyre. The model 1 also comprises principal springs 4, 5 and 6 and principal dampers 7, 8 and 9 which connect the rigid ring 2 to the hub 3 and represent sidewalls of the tyre and air under pressure inside the tyre. The model also comprises supplementary strings 10, 11 and 12 and supplementary dampers 13, 14 and 15 which represent phenomena of deformation of the belt through the effect of a specified vertical load.

Associated with the physical model 1 is a brush model 20 which simulates physical phenomena present in an area of contact between tyre and road. The brush model 20 comprises a rigid plate 21 under which a system representing the tread is applied. The system is preferably bidimensional and comprises numerous parallel, deformable beams 22 orientated longitudinally, the ends of which are hinged to the plate, and numerous microinserts, or rows of springs, 23 arranged in parallel. In this particular case, there are three deformable beams 22 whilst there are 5 rows of microinserts 23 associated with each beam. The bottom ends of the microinserts 23 of the brush model interact with a road or the ground 24. The model reproduces the local deformations occurring inside the area of contact and represents the uniformly distributed lateral and torsional stiffnesses of the portion of tread in the area of contact.

The rigid ring 2 has an equivalent roll radius r [m], mass $M_c$ [kg] and diametral moment of inertia $J_c$ [kg*m$^2$]. The rigid disk 3 has mass $M_m$ [kg] and diametral moment of inertia $J_m$ [kg*m$^2$].

The principal springs 4, 5 and 6 have structural stiffnesses $K_c$, respectively comprising lateral stiffness $K_{cy}$ [N/m] between hub and belt, camber torsional stiffness $K_{c\theta x}$ [Nm/rad] between hub and belt and yawing torsional stiffness $K_{c\theta z}$ [Nm/rad] between hub and belt.

The principal dampers 7, 8 and 9 have structural dampings $R_c$, respectively comprising lateral damping $R_{cy}$ [Ns/m] between hub and belt, camber torsional damping $R_{c\theta x}$ [Nms/rad] between hub and belt and yawing torsional damping $R_{c\theta z}$ [Nms/rad] between hub and belt.

The supplementary springs 10, 11 and 12 have residual stiffnesses $K_r$, respectively comprising residual lateral stiffness $K_{ry}$ [N/m], residual camber torsional stiffness $K_{r\theta x}$ [Nm/rad] and residual yawing torsional stiffness $K_{r\theta z}$ [Nm/rad].

The supplementary dampers 13, 14 and 15 have residual dampings $R_r$, respectively comprising residual lateral damping $R_{ry}$ [Ns/m], residual camber torsional damping $R_{r\theta x}$ [Nms/rad] and residual yawing torsional damping $R_{r\theta z}$ [Nms/rad].

The residual stiffnesses and dampings permit allowance to be made for the variation of local stiffness due to deflection of the tyre. The lateral and residual yawing stiffnesses $K_{ry}$ and $K_{r\theta x}$ connect the bottom end of the rigid ring to the plate, as also does the residual camber stiffness $K_{r\theta z}$. In some cases, the camber deformation of the plate $\rho_b$ (absolute rolling rotation) is not taken into consideration, so that connecting the second end of the spring 11, which represents the residual camber stiffness, directly to the plate is tantamount to connecting it to the ground. In these cases, the stiffness $K_{r\theta x}$ already incorporates the effect due to camber deformability of the brush model.

The equivalent system has stiffness per unit length $c_{py}$ and the contact area has a dynamic length $2a$ and dynamic width $2b$.

With the equivalent system, allowance may be made both for the deformability of the inserts in the tread and for the different speeds between a point of the insert in contact with the road (assuming there is adhesion, this point has a lateral velocity $y'_s=0$) and the corresponding point on the belt. Three factors play a decisive role: the coefficient of friction at the interface between wheel and road, the normal pressure distribution and stiffness of the inserts in the tread.

Shown in FIG. 1 is an absolute trio of reference axes O—X—Y—Z having versos i, j, k, where the origin O coincides with the centre of the hub with the tyre non-deformed, the X axis lies in the plane of the hub and is of longitudinal direction, the Y axis is perpendicular to the X axis and the Z axis is vertical.

The degrees of freedom of the physical model 1 are:

absolute lateral displacement $y_m$ of the hub, absolute yaw rotation $\sigma_m$ of the hub and absolute rolling rotation $\rho_m$ of the hub, relative lateral displacement $y_c$ of the belt with respect to the hub, relative yaw rotation $\sigma_c$ of the belt with respect to the hub and relative rolling rotation $\rho_c$ of the belt with respect to the hub, absolute lateral displacement $y_b$ of the plate, absolute yaw rotation $\sigma_b$ of the plate and absolute rolling rotation $\rho_b$ of the plate.

A further degree of freedom is:

absolute lateral displacement $y_s$ of the bottom ends of the microinserts. This degree of freedom has the objective of reproducing the sideward forces created under the contact and which are linked to the relative displacements between the top and bottom ends of the microinserts. In the case of perfect adhesion of the microinserts, with the tyre not drifting, $y_s=0$.

Motion of the physical model is described by assuming small displacements and small rotations of the hub.

Figure 2:
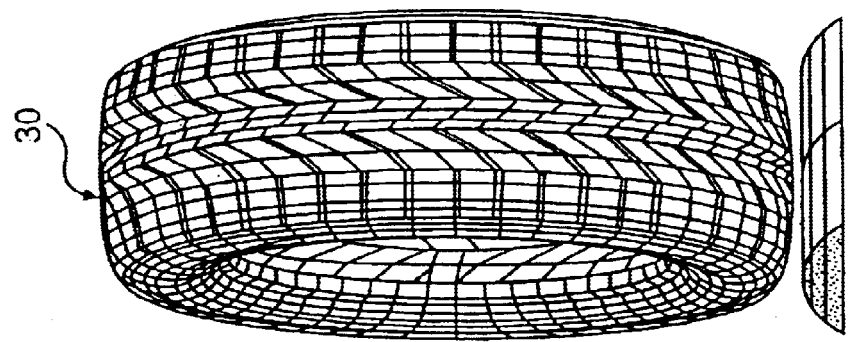
FIG. 2 shows a finite-element model of a tyre used in the method according to the invention.

The tyre is described using a Finite-Element Model (F.E.M.) 30 depicted in FIG. 2. The finite-element model 30 comprises first elements (bricks or shells or multilayer composites) with a selected number of nodes, having appropriately selected form functions, preferably of the first or second order and, even more preferably, linear, and second elements suitable for describing the reinforcing materials. Each first element has a first stiffness matrix which is determined using a selected characterization of the mixes and a second supplementary stiffness matrix which is determined using a selected characterization of the reinforcing materials.

More than ten different types of mixes are usually to be found inside a tyre. Their elastic properties are fed into the finite-element model after selected static and dynamic tests are conducted on specimens of the mixes.

The static tests consist of tensile, compression and shear tests in which the test conditions, forces and elongations applied are established in relation to the properties of the mixes measured previously (hardness, etc.).

The Mooney-Rivlin law of hyperelasticity was taken as the constitutive law. This law describes the specific deformation energy in relation to the derivatives of the displacements (deformations), separating the form variation energy from the volume variation energy (deviatoric and hydrostatic part of the stress tensor).

The coefficients of the constitutive law are calculated in such a way as to minimize the difference between the experimental and the calculated deformation energy.

The dynamic tests are conducted by applying first a static predeformation to the specimens and then an oscillating load with frequency in the range from 0.1 to 100 Hz. The dynamic modulus of the mixture is thus detected as the complex ratio between stress and deformation. As the frequency is changed, the modulus and relative phase between stress and deformation are measured.

The reinforcing materials used are fabrics and of metallic type. In the tyres for automobiles, metallic cords are used only for the belts and fabric cords for the carcass and the outermost belt (zero degrees) located just under the tread band. The metallic cord is subjected to pulling until it breaks and to compression in order to obtain by experimental means the characteristic of the cord from critical load to breaking. This characteristic is implemented in the finite-element model. The fabric cord is also subjected to pulling until it breaks.

The second elements that describe the reinforcing materials are defined within the first elements (bricks, for instance) of the finite-element model 30, by assigning the geometrical disposition of the fabrics, the orientation of the cord, the spacing between the single cords (thickness) and the experimentally obtained traction and compression characteristic of the cord. These characteristics, in relation to the dimensions of the brick element taken, are resumed in a supplementary stiffness matrix which is overlaid on the mixture stiffness matrix, enabling extraction of the cord tensions.

A frequency domain analysis is performed, wherein a linearized response is determined to a harmonic excitation based on the single degrees of freedom of the physical model. The response is obtained by resolving a matrix system, complete with mass, damping and stiffness matrices. Linearization of the matrices is performed at the end of the preliminary static determination stages so that non-linear behaviour of the actual tyre is implicitly taken into account.

By defining the isotropic linear viscoelasticity, the damping and stiffness matrices in relation to frequency may be built. It follows that the relation between stresses and deformations is considerably influenced by the elastic behaviour (a higher modulus of elasticity corresponds in particular to higher frequencies) and the damping of the mix.

In the case of FIG. 2, the finite-element model comprises:
- 17,500 elements (16,000 defined by the user+1,500 generated autonomously, needed for definition of the constraints of the contact between the tyre and the rim it is fitted on and the road);
- approx. 36,000 nodes (19,000 defined by the user+approx. 17,000 generated autonomously, needed for resolution of the hydrostatic part of the stress tensor);
- approx. 74,000 degrees of freedom (19,000 nodes×3 translational degrees of freedom for each node+17,000 degrees of freedom associated with the elements for resolution of the hydrostatic part of the stress tensor).

The equations of motion of the concentrated-parameter physical model 1 of the non-rolling tyre are obtained using the Lagrange method.

The unknown parameters of these equations are identified by comparing the vibrational dynamic response determined using the finite-element model with that obtained from the concentrated-parameter physical model.

The above-described degrees of freedom (independent variables or generalized coordinates) of the physical model are contained in a vector x organized as follows:

$$x = \{y_m \rho_m \sigma_m y_c \rho_c \sigma_c y_b \rho_b \sigma_b\}^T \qquad (1.1)$$

The kinetic energy, expressed through the independent variables of the model, is as follows:

$$E_c = \frac{1}{2} M_m \dot{y}_m^2 + \frac{1}{2} M_c (\dot{y}_m + \dot{y}_c)^2 + \frac{1}{2} J_m \dot{\rho}_m^2 + \qquad (1.2)$$
$$\frac{1}{2} J_m \dot{\sigma}_m^2 + \frac{1}{2} J_c (\dot{\rho}_m + \dot{\rho}_c)^2 + \frac{1}{2} J_c (\dot{\sigma}_m + \dot{\sigma}_c)^2$$

The potential energy, expressed through functions of the independent variables of the model, is as follows:

$$V = \frac{1}{2} K_{cy} y_c^2 + \frac{1}{2} K_{c\theta x} \rho_c^2 + \frac{1}{2} K_{c\theta z} \sigma_c^2 + \qquad (1.3)$$
$$\frac{1}{2} K_{ry} (y_p - y_b)^2 + \frac{1}{2} K_{r\theta z} (s_p - \sigma_b)^2 + \frac{1}{2} K_{r\theta x} (r_p - \rho_b)^2$$

where
- $y_p$ is the absolute lateral displacement of the bottom point of the belt;
- $s_p$ is the absolute yaw rotation of the belt;
- $r_p$ is the absolute camber rotation of the belt.

The relations linking the physical variables to the independent variables are as follows:

$$y_p = y_m + y_c + r^* \rho_m + r^* \rho_c$$
$$s_p = \sigma_m + \sigma_c$$
$$r_p = \rho_m + \rho_c$$

When these relations are inserted in the potential energy equation, the potential energy in relation to the generalized coordinates is obtained. The dissipation energy D is similar in form to the potential energy V.

If Lagrange's theorem is applied to the kinetic energy expression (1.2), the inertia terms $[M]*\ddot{x}$ are found, where the general mass matrix $[M]$ is:

$$[M] = \begin{bmatrix} M_m + M_c & 0 & 0 & M_c & 0 & 0 & 0 & 0 & 0 \\ 0 & J_m + J_c & 0 & 0 & J_c & 0 & 0 & 0 & 0 \\ 0 & 0 & J_m + J_c & 0 & 0 & J_c & 0 & 0 & 0 \\ M_c & 0 & 0 & M_c & 0 & 0 & 0 & 0 & 0 \\ 0 & J_c & 0 & 0 & J_c & 0 & 0 & 0 & 0 \\ 0 & 0 & J_c & 0 & 0 & J_c & 0 & 0 & 0 \\ 0 & 0 & 0 & 0 & 0 & 0 & 0 & 0 & 0 \\ 0 & 0 & 0 & 0 & 0 & 0 & 0 & 0 & 0 \\ 0 & 0 & 0 & 0 & 0 & 0 & 0 & 0 & 0 \end{bmatrix} \qquad (1.4)$$

The matrix includes the concentrated parameters of the model $M_m$, $M_c$, $J_m$ and $J_c$.

On derivation of the expression of the potential energy V with respect to the vector of the independent variables, a general stiffness matrix [K] is obtained (1.5):

$$[K] = \begin{bmatrix} K_{ry} & R_{ry}r & 0 & K_{ry} & K_{ry}r & 0 & -K_{ry} & 0 & 0 \\ K_{ry}r & K_{ry}r^2+K_{r\theta x} & 0 & K_{ry}r & K_{ry}r^2 K_{r\theta x} & 0 & -K_{ry}r & -K_{r\theta x} & 0 \\ 0 & 0 & K_{r\theta z} & 0 & 0 & K_{r\theta x} & 0 & 0 & -K_{r\theta z} \\ K_{ry} & K_{ry}r & 0 & K_{cy}+K_{ry} & K_{ry}r & 0 & -K_{ry} & 0 & 0 \\ K_{ry}r & K_{ry}r^2+K_{r\theta x} & 0 & K_{ry}r & K_{ry}r^2+K_{r\theta x}+K_{c\theta x} & 0 & -K_{ry}r & -K_{r\theta x} & 0 \\ 0 & 0 & K_{r\theta z} & 0 & 0 & K_{c\theta x}+K_{c\theta z} & 0 & 0 & -K_{r\theta z} \\ -K_{ry} & -K_{ry}r & 0 & -K_{ry} & -K_{ry}r & 0 & K_{ry} & 0 & 0 \\ 0 & -K_{r\theta x} & 0 & 0 & -K_{r\theta x} & 0 & 0 & K_{r\theta x} & 0 \\ 0 & 0 & -K_{r\theta z} & 0 & 0 & -K_{r\theta z} & 0 & 0 & K_{r\theta z} \end{bmatrix}$$

The structural and residual stiffnesses of the model are included in this matrix.

Finally, on deriving the expression of the dissipation energy D with respect to the derivative vector before the independent variables, a general damping matrix [R] is obtained (1.6):

$$[R] = \begin{bmatrix} R_{ry} & R_{ry}r & 0 & R_{ry} & R_{ry}r & 0 & -R_{ry} & 0 & 0 \\ R_{ry}r & R_{ry}r^2+R_{r\theta x} & 0 & R_{ry}r & R_{ry}r^2 R_{r\theta x} & 0 & -R_{ry}r & -R_{r\theta x} & 0 \\ 0 & 0 & R_{r\theta x} & 0 & 0 & R_{r\theta z} & 0 & 0 & -R_{r\theta z} \\ R_{ry} & R_{ry}r & 0 & R_{cy}+R_{ry} & R_{ry}r & 0 & -R_{ry} & 0 & 0 \\ R_{ry}r & R_{ry}r^2+R_{r\theta x} & 0 & R_{ry}r & R_{ry}r^2+R_{r\theta x}+R_{c\theta x} & 0 & -R_{ry}r & -R_{r\theta x} & 0 \\ 0 & 0 & R_{r\theta z} & 0 & 0 & R_{c\theta z}+R_{c\theta z} & 0 & 0 & -R_{r\theta z} \\ -R_{ry} & -R_{ry}r & 0 & -R_{ry} & -R_{ry}r & 0 & R_{ry} & 0 & 0 \\ 0 & -R_{r\theta x} & 0 & 0 & -R_{r\theta x} & 0 & 0 & R_{r\theta x} & 0 \\ 0 & 0 & -R_{r\theta z} & 0 & 0 & -R_{r\theta z} & 0 & 0 & R_{r\theta z} \end{bmatrix}$$

The structural and residual dampings of the model are included in this matrix.

The vector of the forces $\underline{F}$ contains the forces and torques acting on the physical model in the different situations the model is found in, as will be illustrated later.

In short, the equations of motion are obtained in matrix form:

$$[M]\underline{\ddot{x}}+[R]\underline{\dot{x}}+[K]\underline{x}=\underline{F} \quad (1.7)$$

In this equation, the contributions linked respectively to the degrees of freedom of the hub, the belt and the tread may be discerned:

$$\begin{bmatrix} M_{mm} & M_{mc} & M_{mq} \\ M_{cm} & M_{cc} & M_{cq} \\ M_{qm} & M_{qc} & M_{qq} \end{bmatrix} \cdot \underline{\ddot{x}} + \quad (1.8)$$

$$\begin{bmatrix} R_{mm} & R_{mc} & R_{mq} \\ R_{cm} & R_{cc} & R_{cq} \\ R_{qm} & R_{qc} & R_{qq} \end{bmatrix} \cdot \underline{\dot{x}} + \begin{bmatrix} K_{mm} & K_{mc} & K_{mq} \\ K_{cm} & K_{cc} & K_{cq} \\ K_{qm} & K_{qc} & K_{qq} \end{bmatrix} \cdot \underline{x} = \begin{Bmatrix} F_m \\ F_c \\ F_q \end{Bmatrix}$$

To identify the concentrated parameters of the physical model, a series of virtual dynamic tests, simulated on the finite-element model 30, is defined, in which the tyre is variously excited and under different conditions so as to highlight the contribution of each of the terms that has to be identified.

For each test, the finite-element model is used to determine the frequency response of particular quantities measured at precise points of the tyre.

To obtain the frequency responses of the concentrated-parameter physical model, the equations of motion for the selected tests are defined.

For each test and for each frequency response of the quantities taken into consideration (displacements of the points considered, constraining reactions, etc.), the difference is computed between the results obtained from the finite-element model and those obtained using the concentrated-parameter physical model. This difference is considered an error and is defined as $$err=\{v-v_{FEM}\} \quad (1.9)$$

An objective function is then also defined, consisting of the weighted sum of the differences found on each channel (each channel corresponds to a quantity considered) between the responses of the concentrated-parameter physical model and those of the finite-element model. The objective function may be expressed as follows:

$$f = \sum_{i=1}^{N\ channels} \|v_i - v_{iFEM}\| + P_i \quad (1.10)$$

Finally each stiffness and damping parameter of the physical model is attributed that value by means of which the objective function is minimized, where the vector of the weightings P⁻ enables the various channels to be given different weightings.

To identify the values of the three stiffnesses and the three dampings present between the rigid ring and the hub, two virtual tests are conducted on the tyre blown up and not pressed to the ground. Also obtained at this stage of the identification are the values for the mass and diametral moment of inertia of the belt that most closely adapt behaviour of the model to that of the actual tyre. In particular, the value of the mass of the belt $M_c$ is determined in the first test and the value of the diametral moment of inertia of the belt $J_c$ in the second test.

The mass of the hub $M_m$, on the other hand, is determined by imposing the conservation of the total mass of the tyre: $M_{tot}=M_c+M_m$. A first sharing of the masses is then made with a view to defining the first-attempt values of the mass of the belt and its diametral moment of inertia. These values will then be modified in the identification stage in order to optimize dynamic behaviour of the model.

Figure 3:
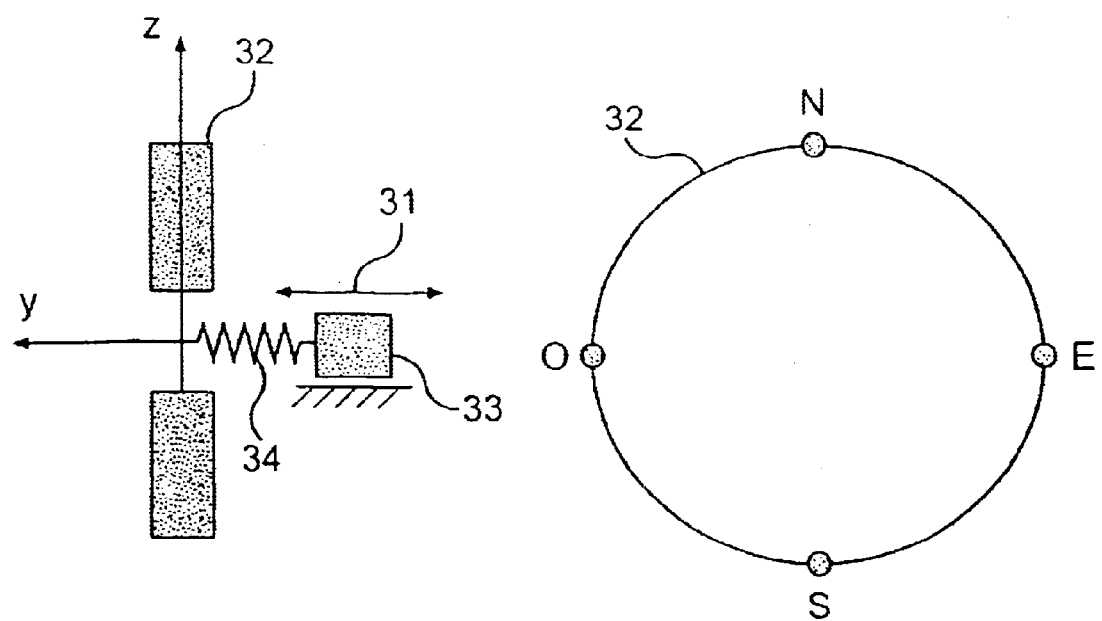
FIGS. 3–6 are schematic representations of test procedures with a non-rolling tyre to which the concentrated-parameter physical model of FIG. 1 is subjected.

A first test (test A) on the finite-element model consists in exciting the blown-up tyre not pressed to the ground by imposing a translation in the Y direction on the hub. The lateral displacement at particular points of the belt of the tyre and the force set up between hub and belt are measured. A schematic representation of the first test is shown in FIG. 3 depicting belt 32, hub 33 in transverse section and a connection spring 34, which represents the lateral stiffness and damping between belt and hub. Also shown are an arrow 31 representing the displacement imposed on the hub in the Y direction, and a side view of the belt 32, in which the cardinal points N, E, S and W are shown. As the belt is symmetrical, the lateral displacement of one cardinal point only of the belt 32 is considered in this test.

A first comparison test (A) is carried out on the concentrated-parameter tyre model, as will be illustrated later. When the frequency responses of the quantities measured in these first two tests (lateral displacement of a cardinal point of the belt and force between belt and hub) are compared and the errors minimized, the following concentrated parameters of the model 1 may then be determined:

the lateral stiffness between hub and belt $K_{cy}$,
the lateral damping between hub and belt $R_{cy}$,
the mass of the belt $M_c$.

Figure 4:
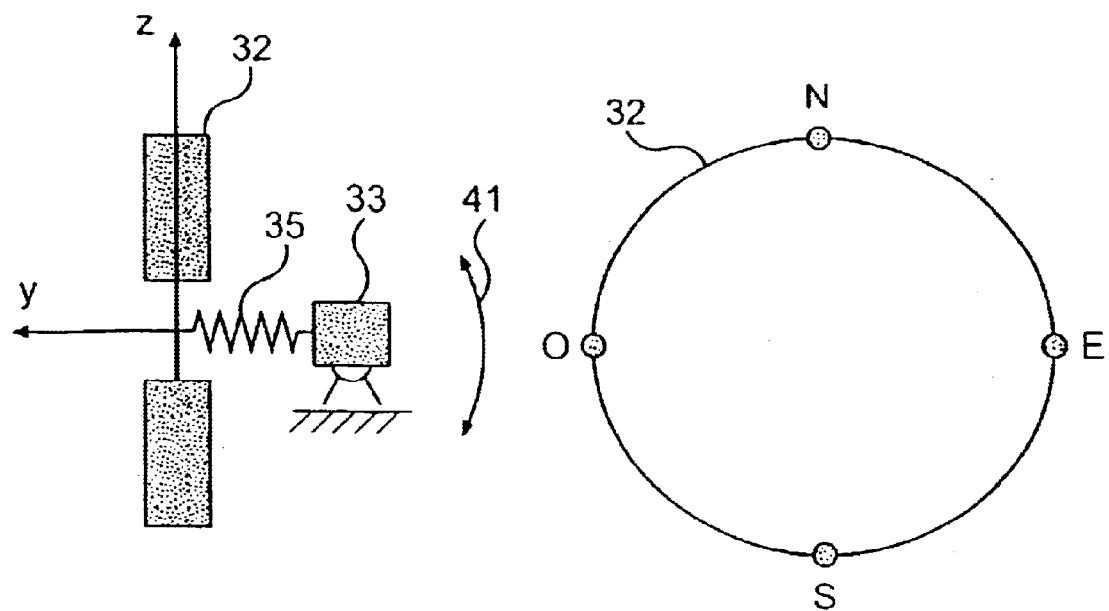

A second test (test B) on the finite-element model consists in exciting the blown-up tyre not pressed to the ground by imposing a camber rotation on the hub. The lateral displacement at particular points of the belt (camber rotation) and the torque transmitted between hub and belt are measured. A schematic representation of the second test is shown in FIG. 4 depicting the belt 32, the hub 33 in transverse section and a connection spring 35, which schematically represents the camber torsional stiffness and damping between belt and hub, respectively $K_{c\theta x}$ and $R_{c\theta x}$. Also shown are an arrow 41 representing the rotation imposed on the hub about the X axis, and a side view of the belt 32, in which the cardinal points N, E, S and W are indicated. As the belt is symmetrical, the lateral displacement of one cardinal point only of the belt 32, selected indifferently between points N and S, is considered in this test.

A second comparison test (B) is carried out on the concentrated-parameter tyre model, as will be illustrated later. Again in this case, when the frequency responses of the quantities measured in these second two tests (lateral displacement of a cardinal point of the belt and torque between belt and hub) are compared and the errors minimized, the following concentrated parameters of the model 1 may then be determined:

the diametral moment of inertia of the belt $J_c$,
the camber torsional stiffness between hub and belt $K_{c\theta x}$,
the camber torsional damping between hub and belt $R_{c\theta x}$,
the yawing torsional stiffness between hub and belt $K_{c\theta z}$ (by symmetry with $K_{c\theta x}$)
the yawing torsional damping between hub and belt $R_{c\theta z}$ (by symmetry with $R_{c\theta x}$).

The connection between hub and belt is made in like manner for both the camber rotations and the yaw rotations and it is possible to consider that the behaviour of the belt not pressed to the ground is axial-symmetrical.

Figure 5:
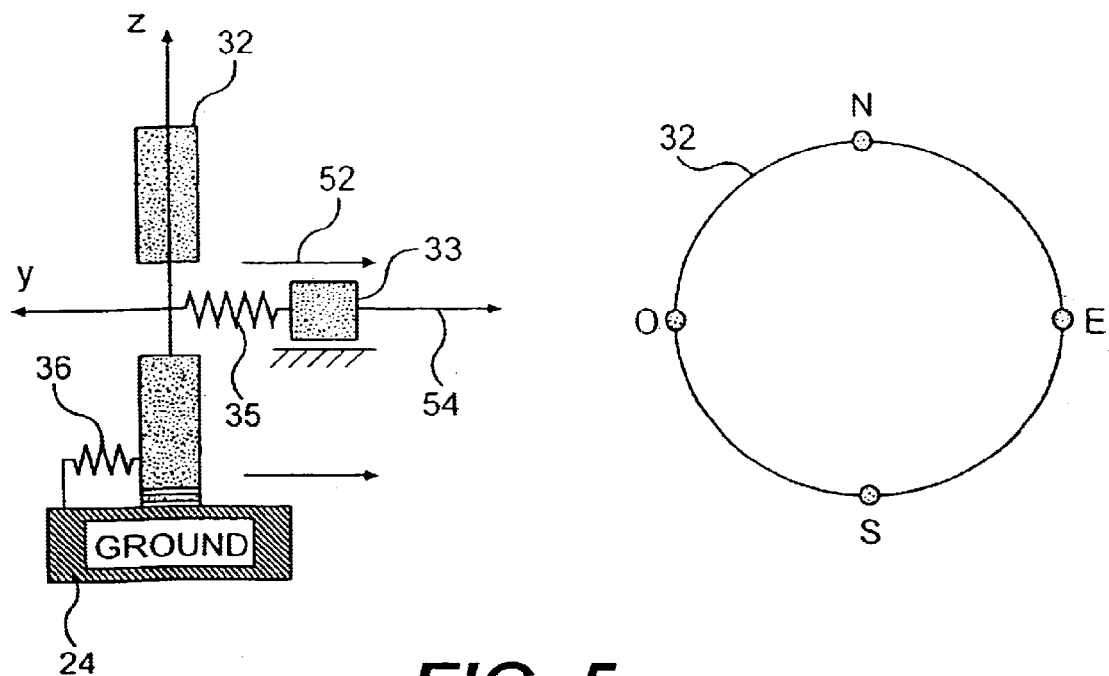

A third test (test C) on the finite-element model consists in exciting the tyre blown up, pressed to the ground and bereft of its tread (rasped) at least in the area of contact by the application to the hub of a force in the Y direction. The lateral displacement of the hub and particular points of the belt are measured. A schematic representation of the third test is shown in FIG. 5 depicting the belt 32, the hub 33 in transverse section, a connection spring 36 (in addition to the one described above, indicated with numeral 35) which schematically represents the residual, lateral and camber stiffnesses and dampings between belt and ground 24. Also shown are an arrow 51 representing the force imparted, an arrow 52 representing the lateral displacement of the hub and a front view of the belt 32, in which the cardinal points N, E, S and W are indicated. In this test, the lateral displacement of the N and E cardinal points of the belt 32 is considered.

A third comparison test (C) is carried out on the concentrated-parameter tyre model, as will be illustrated later. When the frequency responses of the quantities measured in these third two tests (lateral displacement of the hub and of the N and E cardinal points of the belt) are compared and the errors minimized, the following concentrated parameters of the model 1 may then be determined:

the residual lateral stiffness $K_{ry}$,
the residual lateral damping $R_{ry}$,
the residual camber stiffness $K_{r\theta x}$,
the residual camber damping $R_{r\theta x}$.

Figure 6:
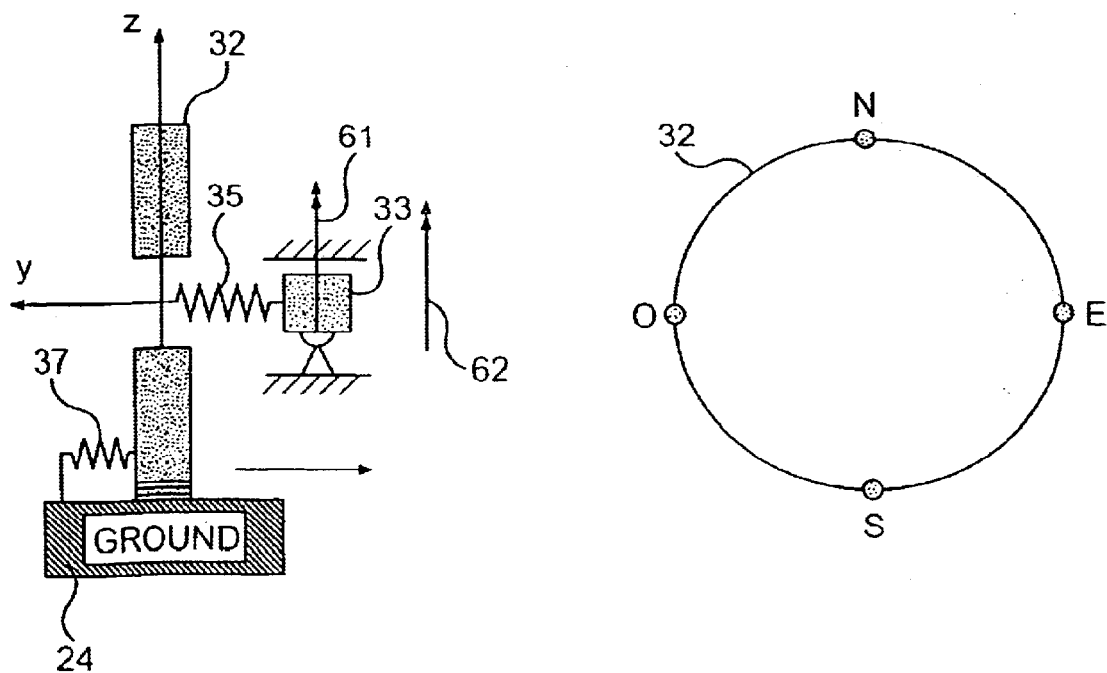

A fourth test (test D) on the finite-element model consists in exciting the tyre blown up, pressed to the ground and bereft of its tread (rasped) at least in the area of contact by the application to the hub of a yawing torque about the Z axis. The yaw rotation of the hub and the displacement at particular points of the belt are measured. A schematic representation of the fourth test is shown in FIG. 6 depicting the belt 32, the hub 33 in transverse section, a connection spring 37 (in addition to the one described above, indicated with numeral 35) which schematically represents the residual yawing stiffnesses and dampings between belt and ground 24. Also shown are an arrow 61 representing the yawing torque imparted, an arrow 62 representing the rotation of the hub and a front view of the belt 32, in which the cardinal points N, E, S and W are indicated. In this test, the lateral displacement of the E and W cardinal points of the belt 32 is considered.

A fourth comparison test (D) is carried out on the concentrated-parameter tyre model, as will be illustrated later. When the frequency responses of the quantities measured in these fourth two tests (yaw rotation of the hub and displacement of the E and W cardinal points of the belt) are compared and the errors minimized, the following concentrated parameters of the model 1 may then be determined:

the residual yawing stiffness $K_{r\theta z}$,
the residual yawing damping $R_{r\theta z}$.

During the third and fourth tests, in addition to the identification of the residual quantities, the stiffness and damping values already identified in the first and second tests are also modified in order to better describe the transfer functions given by the finite-element model. The stiffness and damping values between hub and belt are therefore modified slightly from those identified earlier.

To obtain the frequency responses of the physical model 1 needed for the identification of its concentrated parameters, the equations of motion relative to the four tests described above are obtained.

The tests A and B are carried out with the tyre blown up and not pressed to the ground, imposing displacements on the hub.

The free degrees of freedom (generalized coordinates) of the physical model are:

$$\underline{x}_l^{A\text{-}B} = \{y_c \rho_c \sigma_c y_b \rho_b \sigma_b\}^T \tag{1.11}$$

whereas the constrained degrees of freedom (constrained coordinates) are:

$$\underline{x}_v^{A\text{-}B} = \{y_m \rho_m \sigma_m\}^T \tag{1.12}$$

As stated above, only a translation in the Y direction is imposed on the hub in test A and therefore $\rho_m = \sigma_m = 0$, whilst only a camber rotation is imposed on the hub in test B and therefore $y_m = \sigma_m = 0$. Furthermore the tyre is raised off the ground and the residual stiffnesses and dampings relative to the tread cancel each other out.

Under these conditions, from the general matrices of mass, stiffness and damping reported above for the concentrated-parameter physical model, a mass matrix $[M]^{A\text{-}B}$, a stiffness matrix $[K]^{A\text{-}B}$ and a damping matrix $[R]^{A\text{-}B}$ are obtained.

When a partition is made of the matrices in relation to the free and constrained coordinates, equations of motion in scalar form are obtained from (1.8):

$$\begin{cases} (M_m + M_c)\ddot{y}_m + M_c\ddot{y}_c = F_{ym} \\ (J_m + J_c)\ddot{\rho}_m + J_c\ddot{\rho}_c = C_{\rho m} \\ (J_m + J_c)\ddot{\sigma}_m + J_c\ddot{\sigma}_c = C_{\sigma m} \end{cases} \tag{1.13}$$

where $F_{ym}$, $C_{\rho m}$ and $C_{\sigma m}$ represent the forces and torques imposed on the hub.

These equations govern the motion of the system in the simulated tests A and B.

For the displacements imparted to the hub, the equations are:

$$\begin{cases} M_c\ddot{y}_c + R_{cy}\dot{y}_c + K_{cy}y_c = -M_c\ddot{y}_m \\ J_c\ddot{\rho}_c + R_{c\theta x}\dot{\rho}_c + K_{c\theta x}\rho_c = -J_c\ddot{\rho}_m \\ J_c\ddot{\sigma}_c + R_{c\theta z}\dot{\sigma}_c + K_{c\theta z}\sigma_c = -J_c\ddot{\sigma}_m \end{cases} \tag{1.14}$$

The frequency responses must now be determined of the quantities measured in the tests A and B to be able to compare the frequency responses given by the finite-element model with the frequency responses of the concentrated-parameter model.

In the test A, with the physical model, the frequency response of the lateral displacement of the belt is reconstructed, taking into consideration the first equation of the system (1.14). The displacement imparted on the hub is:

$$y_m^A = A \cdot e^{i\Omega t} \tag{1.15}$$

the complete differential equation to be resolved is as follows:

$$M_c\ddot{y}_c^A + R_{cy}\dot{y}_c^A + K_{cy}y_c^A = M_c \cdot \Omega^2 \cdot A \cdot e^{i\Omega t} \tag{1.16}$$

The solution of this equation, having a sinusoidal force agent equivalent to $y_m$, is of the type:

$$y_c^A = B \cdot e^{i\Omega t} \tag{1.17}$$

By means of substitutions and simplifications, the frequency response is obtained for the degree of freedom $y_c$ upon variation of $\Omega$, that is to say the frequency response of the lateral displacement of the belt with respect to the hub.

$$y_c^A = \frac{M_c \cdot \Omega^2 \cdot A}{(-M_c \cdot \Omega^2 + i \cdot \Omega \cdot R_{cy} + K_{cy})} \cdot e^{i\Omega t} \tag{1.18}$$

As the finite-element model provides the absolute displacement of the points of the belt, the frequency response of the absolute lateral displacement of the belt may be determined from the absolute lateral displacement:

$$y_{c\_ass}^A = y_c^A + y_m^A = \left[ \frac{M_c \cdot \Omega^2 \cdot A}{(-M_c \cdot \Omega^2 + i \cdot \Omega \cdot R_{cy} + K_{cy})} + 1 \right] A \cdot e^{i\Omega t} \tag{1.19}$$

Upon computing the difference between the lateral displacement of the physical model and that provided by the finite-element model, an error is obtained that is a function of $M_c$, $K_{cy}$ and $R_{cy}$. In the identification stage, this error is minimized, that is to say, values are chosen for $M_c$, $K_{cy}$ and $R_{cy}$ that make the error minimum.

In the test A, the frequency response of the force transmitted between hub and belt provided by the finite-element model is also compared with that provided by the concentrated-parameter physical model. This force is equal to:

$$F_{hub\text{-}belt}^A = (K_{cy} + i \cdot \Omega \cdot R_{cy}) \cdot B \cdot e^{i\Omega t} \tag{1.20}$$

Again with this quantity, when the difference is computed between the frequency response of the force determined with the finite-element model and that obtained using the concentrated-parameter physical model, a second error is obtained that is also function of $M_c$, $K_{cy}$, and $R_{cy}$. The above-stated quantities are obtained upon minimization of this error.

In the test B, with the physical model, the frequency response of the rotation of the belt is reconstructed and the same method of procedure as the test A is then followed. The second equation of the system (1.14) is considered, starting from a camber rotation imparted to the hub of the type:

$$\rho_m^B = C \cdot e^{i\Omega t} \tag{1.21}$$

the frequency response is obtained of the absolute camber rotation of the belt:

$$\rho_{c\_ass}^B = \rho_c^B + \rho_m^B = \left[ \frac{J_c \cdot \Omega^2}{(-J_c \cdot \Omega^2 + i \cdot \Omega \cdot R_{c\theta x} + K_{c\theta x})} + 1 \right] C \cdot e^{i\Omega t} \tag{1.22}$$

and, from this, the frequency response of the rotation of the lateral displacement of the S point of the belt is determined:

$$y_{c\_ass\_south}^B = \rho_{c\_ass}^B \cdot r \tag{1.23}$$

Also determined is the frequency response of the torque transmitted between hub and belt:

$$C_{hub\text{-}belt}^B = (K_{c\theta x} + i \cdot \Omega \cdot R_{c\theta x}) \cdot D \cdot e^{i\Omega t} \tag{1.24}$$

Upon computing the difference between the displacement $y_{c\_ass\_south}^B$ and the torque $C_{hub\text{-}belt}$ of the physical model and those given by the finite-element model, an error is obtained that is a function of the quantities $J_c$, $K_{c\theta x}$ and $R_{c\theta x}$.

In the identification stage, this error is minimized and values are identified for the above-mentioned quantities.

In the tests C and D, with the tyre blown up, pressed to the ground and bereft of tread, the free degrees of freedom and the constrained degrees of freedom of the physical model are determined in the two test situations and an axial force is imposed on the hub in the Y direction, in the test C, and a yawing torque about the Z axis, in the test D. When these conditions are put into the equations of motion (1.7) and (1.8), the equations of motion for the free degrees of freedom of the physical model are obtained and the complex vector of the free degrees of freedom is determined. This vector contains both the modulus and the phase of the free degrees of freedom in question.

In the test C, from this vector, the frequency responses of the lateral displacement of the hub, of the N point and of the E point of the belt are determined. In the identification stage, the difference is computed between the frequency response obtained from the finite-element model and that obtained from the concentrated-parameter physical model and a second error is obtained which is a function of $K_{ry}$, $R_{ry}$, $K_{r\theta x}$ and $R_{r\theta x}$. On minimizing this error, the above-mentioned quantities are determined.

In the test D, from the above-mentioned vector, the frequency responses are determined of the yaw rotation of the hub and of the displacement of the E point of the belt in relation to the quantities $K_{r\theta z}$ and $R_{r\theta z}$. These quantities are determined by minimizing the error resulting as the difference between the frequency response provided by the finite-element model and that provided by the concentrated-parameter physical model.

Once the concentrated parameters of the physical model have been identified, it is possible to determine some quantities that allow an evaluation, or an initial approximation at least, to be made of the behaviour of the tyre. These quantities are the total drift stiffness of the tyre $K_d$, comprised in turn by the structural stiffness $K_c$, the tread stiffness $K_b$ and the total camber stiffness $K_\gamma$ of the said tyre.

The stiffness $K_d$ is an important parameter for the purposes of definition of the tyre in that it provides an indication of the effect that the design parameters have on the drift behaviour.

To obtain $K_d$, the free and constrained degrees of freedom are partitioned:

$$\underline{x}_l = \{y_c \rho_c \sigma_c y_b \sigma_b\} \quad (1.25)$$

A further partition is made of the vector $\underline{x}_l$ into internal (of the belt) and external (of the tread) degrees of freedom:

$$\underline{x}_l = \{\underline{x}_e \underline{x}_i\}^T = \{\{y_b \sigma_b\}\{y_c \rho_c \sigma_c\}\}^T \quad (1.26)$$

The stiffness matrix (1.5) is then modified following these partitions and the equations of motion can be written as follows for the free degrees of liberty:

$$\begin{cases} [K_{ee}]\underline{x}_e + [K_{ei}]\underline{x}_i = \underline{E}_e \\ [K_{ie}]\underline{x}_e + [K_{ii}]\underline{x}_i = \underline{E}_i = \underline{0} \end{cases} \quad (1.27)$$

Remembering that no external forces act on the degrees of internal freedom, the second equation of the system (1.27) may be resolved in relation to the external degrees of freedom, the result inserted in the first equation and the latter made explicit in relation to the external coordinates $\underline{x}_e$ alone. At this point a stiffness matrix is defined for the tyre structure, limited to the external degrees of freedom:

$$\begin{cases} [K_{ee}]\underline{x}_e - [K_{ei}][K_{ii}]^{-1}[K_{ie}]\underline{x}_e = \underline{E}_e \\ \underline{x}_i = -[K_{ii}]^{-1}[K_{ie}]\underline{x}_e \end{cases} \quad (1.28)$$

The resolving equation is:

$$[\hat{K}_{ee}]\underline{x}_e = \underline{E}_e \quad (1.29)$$

wherein:

$$[\hat{K}_{ee}] = [K_{ee}] - [K_{ei}][K_{ii}]^{-1} \cdot [K_{ie}] \quad (1.30)$$

is a matrix (2,2). The first element of the first row of this matrix represents the total stiffness of the tyre $K_d$:

$$K_d = \hat{K}_{ee}(1,1) \quad (1.31)$$

With the stiffnesses of the tyre with concentrated parameters known from the identification procedure, it is possible to calculate $K_d$.

The total camber stiffness $K_\gamma$ of the tyre provides an indication of the tyre's ability to exit from a longitudinal track, namely parallel to the direction of movement of the tyre, made on the road when the tyre is moving with rectilinear motion. The method according to the invention enables calculation of $K_\gamma$ without the need to make and test a tyre prototype, as is generally done.

To determine $K_\gamma$, a virtual test, practically equal to the experimental one, is carried out consisting in imposing a selected camber angle on the hub, with a null drift angle, and in measuring the sideward force created on the hub.

The free and constrained degrees of freedom are identified:

$$\underline{x}_l^\gamma = \{y_c \rho_c \sigma_c y_b \sigma_b\} \quad (1.32)$$

$$\underline{x}_v^\gamma = \{y_m \rho_m \sigma_m \rho_b\} \quad (1.33)$$

By imposing a camber angle and leaving all the other constrained degrees of freedom unaltered, the sideward force is determined by resolving the matrix equation:

$$[K]\underline{x} = \underline{F} \quad (1.34)$$

where the matrix [K] is the (1.5) and $\underline{F}$ a vector containing the forces acting on the tyre. Figuring among these are the force and torque due to the deformations undergone by the inserts of the tread in the assumption that there is perfect adhesion. These two contributions are:

$$F_{yb} = 2 \cdot c_p \cdot a \cdot y_b$$

$$M_{zb} = \tfrac{2}{3} \cdot c_p \cdot a^3 \cdot \sigma_b \quad (1.35)$$

As the previous two terms are functions of two of the nine degrees of freedom of the concentrated-parameter model ($y_b$ and $\sigma_b$), they must be expressed in function of these degrees of freedom and thus be brought to the left-hand side of the equals sign in the matrix equation reported above (1.34), so that they too contribute to determining the stiffness matrix of the system.

The partitioned matrices $K_{ll}^\gamma$, $K_{lv}^\gamma$, $K_{vl}^\gamma$ and $K_{vv}^\gamma$ are known:

$$[K_{vv}]^\gamma = \begin{bmatrix} K_{ry} & K_{ry}r & 0 & 0 \\ K_{ry}r & K_{ry}r^2 + K_{r\theta x} & 0 & -K_{r\theta x} \\ 0 & 0 & K_{r\theta z} & 0 \\ 0 & -K_{r\theta x} & 0 & K_{r\theta x} \end{bmatrix} \quad (1.36)$$

$$[K_{vl}]^\gamma = \begin{bmatrix} K_{ry} & K_{ry}r & 0 & K_{ry} & 0 \\ K_{ry}r & K_{ry}r^2 + K_{r\theta x} & 0 & -K_{ry}r & 0 \\ 0 & 0 & K_{r\theta x} & 0 & -K_{r\theta z} \\ 0 & -K_{r\theta x} & 0 & 0 & 0 \end{bmatrix} \quad (1.37)$$

$$[K_{lv}]^\gamma = \begin{bmatrix} K_{ry} & K_{ry}r & 0 & 0 \\ K_{ry}r & K_{ry}r^2 + K_{r\theta x} & 0 & -K_{r\theta x} \\ 0 & 0 & K_{r\theta z} & 0 \\ -K_{ry} & -K_{ry}r & 0 & 0 \\ 0 & 0 & -K_{r\theta z} & 0 \end{bmatrix} \quad (1.38)$$

$$[K_{ll}]^\gamma = \begin{bmatrix} K_{cy} + K_{ry} & K_{ry}r & 0 & -K_{ry} & 0 \\ K_{ry}r & K_{ry}r^2 + K_{r\theta x} + K_{c\theta x} & 0 & -K_{ry}r & 0 \\ 0 & 0 & K_{c\theta z} + K_{r\theta z} & 0 & -K_{r\theta z} \\ -K_{ry} & -K_{ry}r & 0 & K_{ry} - 2 \cdot c_p \cdot a & 0 \\ 0 & 0 & -K_{r\theta z} & 0 & K_{r\theta z} - \frac{2}{3} \cdot c_p \cdot a^3 \end{bmatrix} \quad (1.39)$$

From these, the vector of the forces acting on the constrained degrees of freedom may be calculated using the equation:

$$\underline{F}_v^\gamma = \{-[K_{vl}]^\gamma \cdot [K_{ll}]^{\gamma-1} \cdot [K_{lv}]^\gamma + [K_{vv}]^\gamma\} \underline{x}_v^\gamma \quad (1.40)$$

Remembering that:

$$[\hat{K}]^\gamma = -[K_{vl}]^\gamma \cdot [K_{ll}]^{\gamma-1} \cdot [K_{lv}]^\gamma + [K_{vv}]^\gamma \quad (1.41)$$

is a matrix (4,4), the first element of the second row, which is the total camber stiffness of the tyre, is determined:

$$K_\gamma = \hat{K}^\gamma(1,2) \quad (1.42)$$

To demonstrate the validity of the method according to the invention, the results obtained are brought into the procedure for the identification of the concentrated parameters of the physical model of a tyre of the 55 range (H/C section ratio of 0.55) manufactured by the Applicant. In the graphs of FIGS. 7–15, the frequency response obtained with the concentrated-parameter physical model is represented with a continuous line, while the frequency response obtained with the finite-element model during the tests A, B, C and D is represented with asterisks.

Figure 7:
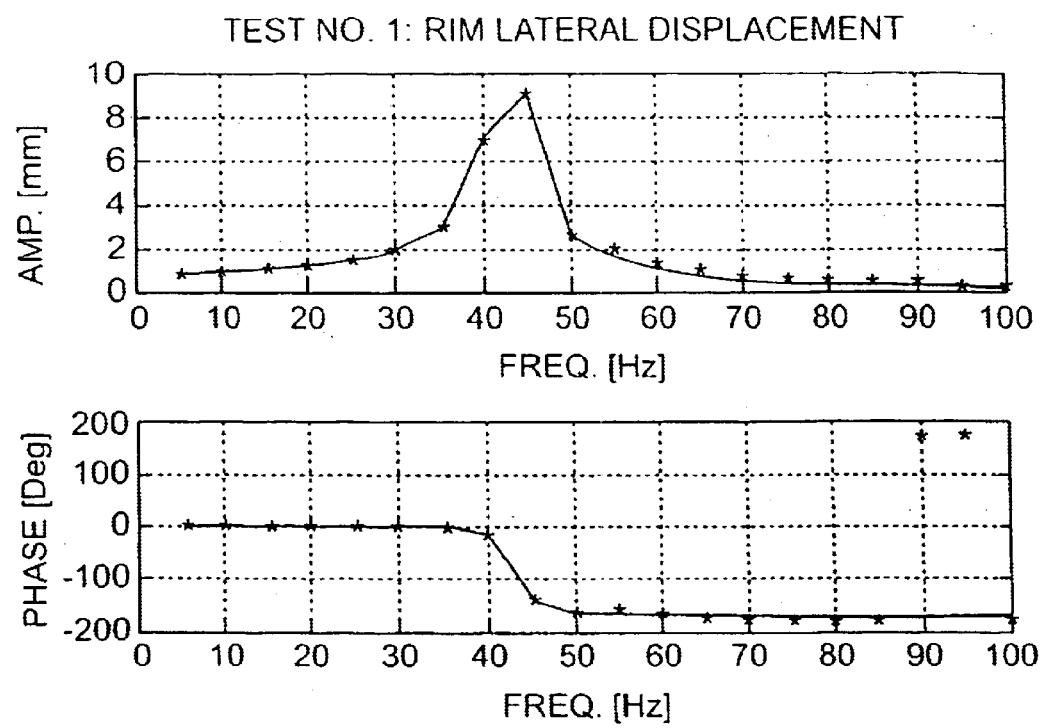
Figure 8:
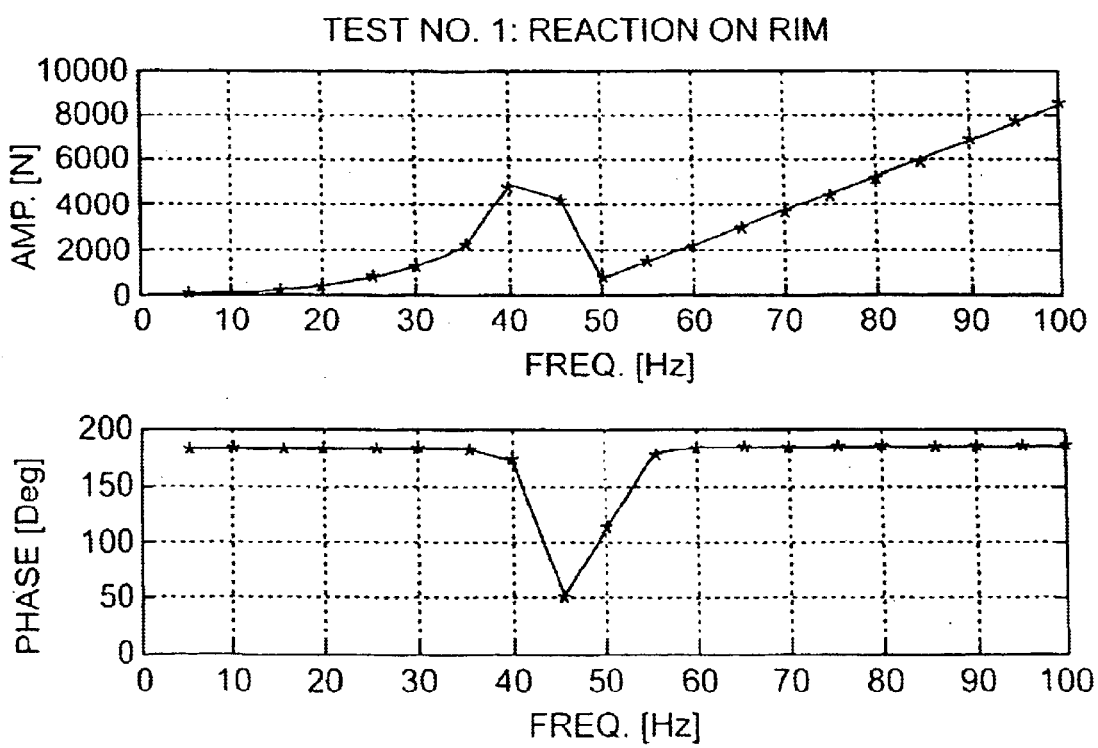

FIG. 7 is a graph of the frequency response of the displacement of a point of the belt obtained during the test A from the physical model and from the finite-element model, whereas FIG. 8 is a graph of the frequency response of the force created between the hub and the belt, again in the test A.

The values of the concentrated parameters identified with the test A are reported in the following Table I.

TABLE I

| Parameter | Symbol | Value identified |
|---|---|---|
| Linear stiffness between hub and belt[9] | $K_{cy}$ | 5 e$^5$ [N/m] |
| Linear damping between hub and belt | $R_{cy}$ | 116.906 [Ns/m] |
| Belt mass | $M_c$ | 7.792 [kg] |

It may be observed from the graphs of FIGS. 7 and 8 that the frequency response has a single resonance peak. Corresponding to this peak is a mode of vibration of the tyre illustrated in FIG. 16. This mode of vibration maintains the tread band substantially rigid and may therefore be described by the concentrated-parameter model, that simulates the sidewall and the belt with a rigid ring. The parameters identified are therefore valid in a set of frequencies ranging from 0 to 100 Hz, since modes of vibration that considerably deform both sidewall and belt appear with frequencies that are higher than this.

Figure 9:
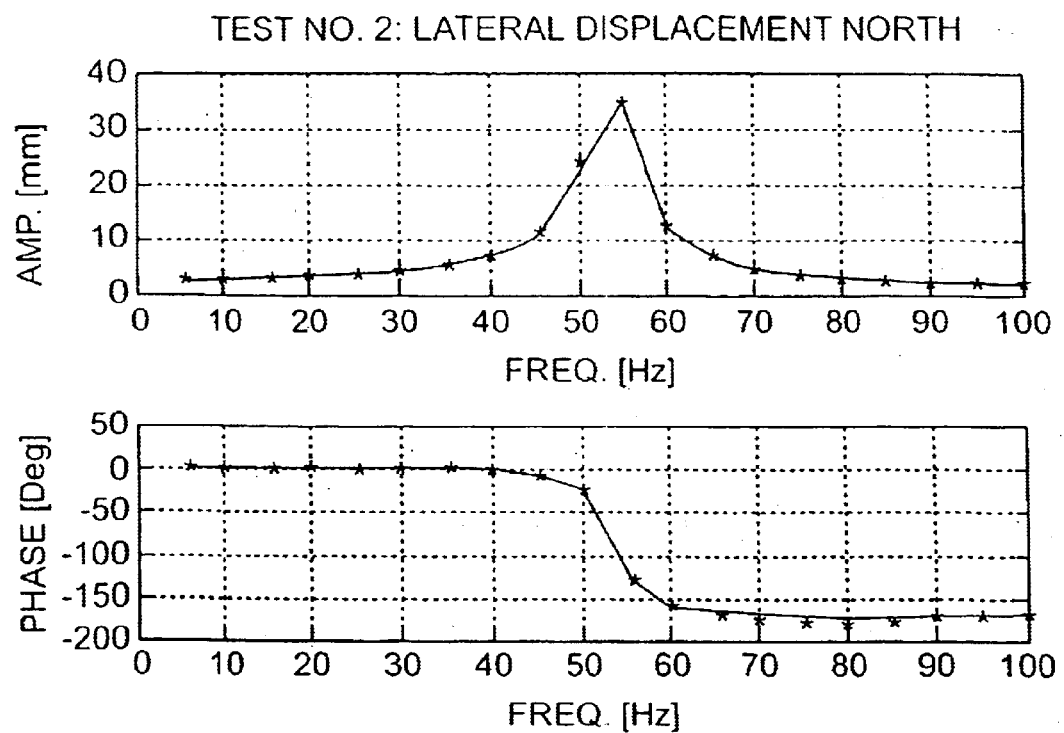
Figure 10:
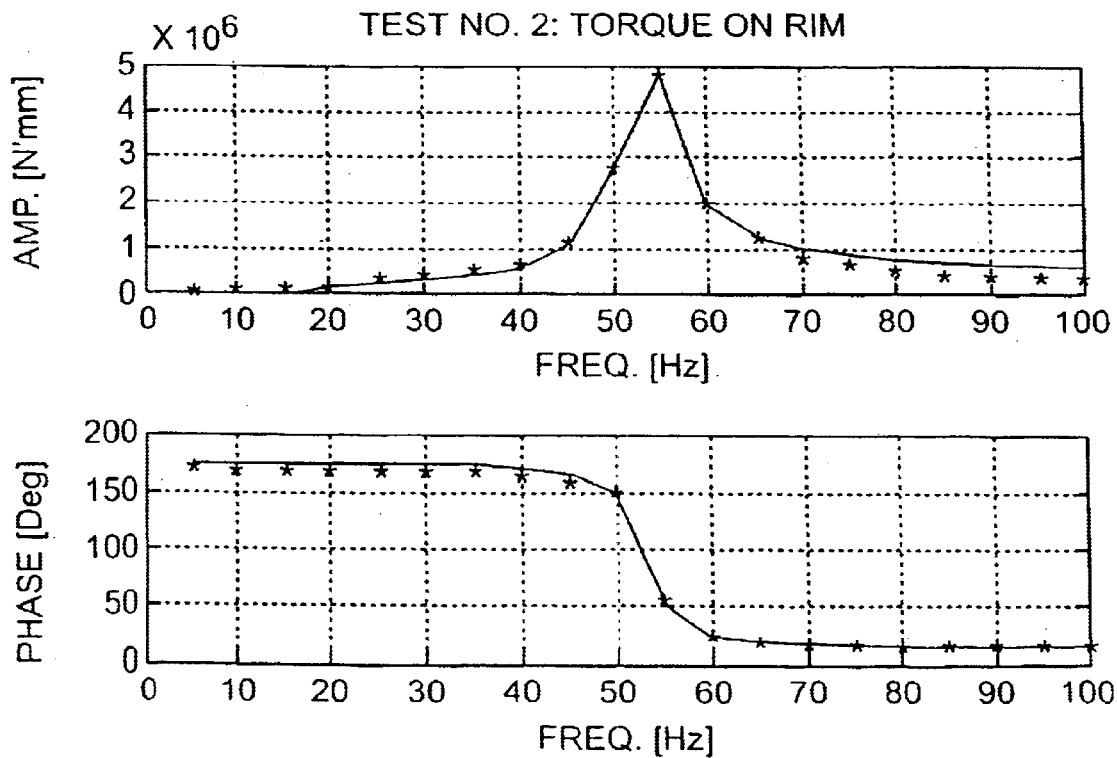

FIG. 9 is a graph of the frequency response of the displacement of a point of the belt obtained during the test B from the physical model and from the finite-element model, whereas FIG. 10 is a graph of the frequency response of the torque created between the hub and the belt, again in the test B.

The values of the concentrated parameters identified with the test B are reported in the following Table II.

TABLE II

| Parameter | Symbol | Value identified |
|---|---|---|
| Torsional stiffness between hub and belt | $K_{c\theta x}/K_{c\theta z}$ | 3.3 e$^4$ [*N/m] |
| Torsional damping between hub and belt | $R_{c\theta x}/R_{c\theta z}$ | 8.217 [Ns/m] |
| Diametral moment of inertia of belt | $J_c$ | 0.373 [kg*m$^2$] |

As in the previous test, again in this one there is a single resonance peak corresponding to the modal deformation of the tyre shown in FIG. 17.

In the test C, consideration also needs to be given to the normal load bearing on the tyre. Three loads corresponding to three standard working conditions were applied to the tyre: a reduced load of between 2,500 and 3,000 N, an intermediate load of between 3,500 and 4,800 N and a high load of between 5,100 and 6,500 N.

Figure 11:
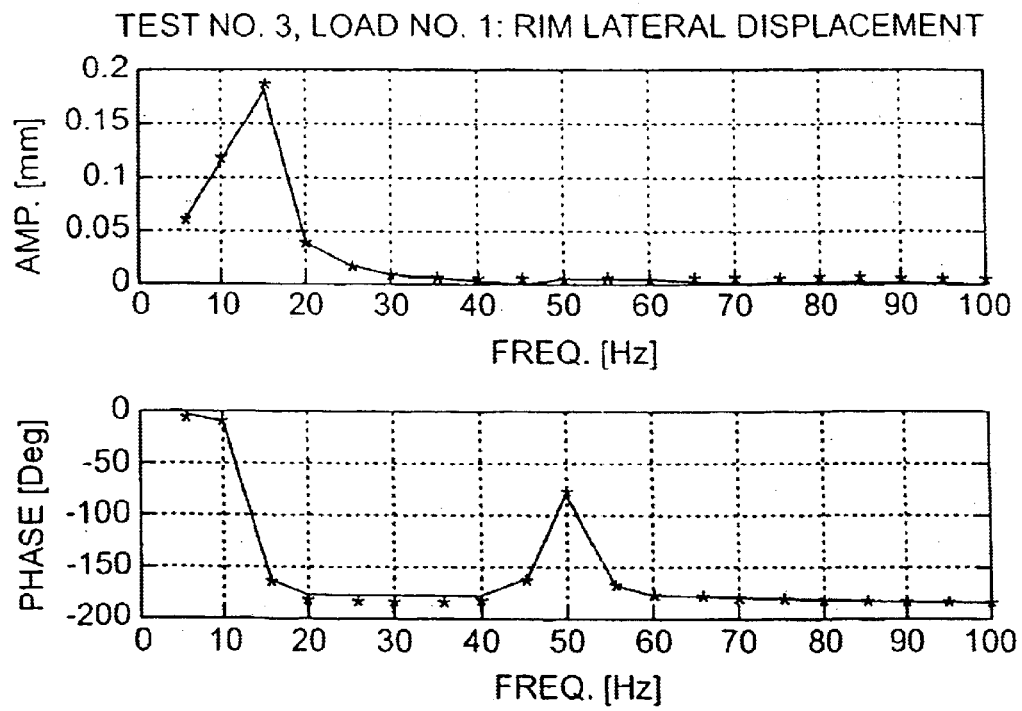
Figure 12:
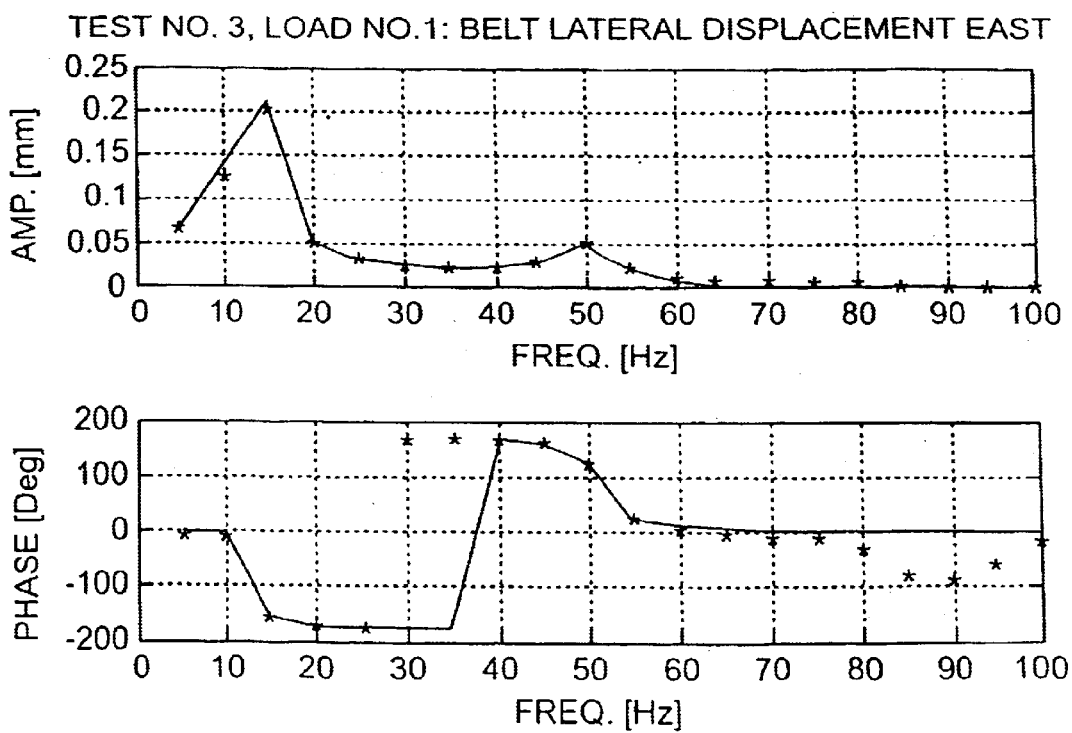
Figure 13:
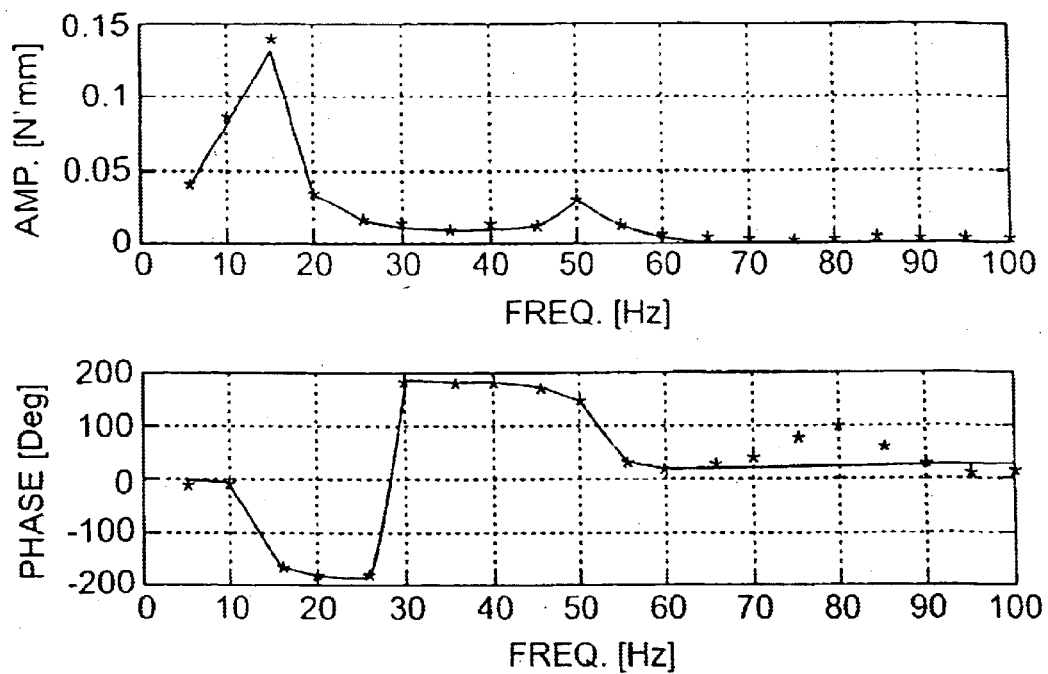

FIG. 11 is a graph of the frequency response of the lateral displacement of the hub obtained from the physical model and from the finite-element model during the test C, with a normal load of 2,914 N bearing on the tyre, whereas FIGS. 12 and 13 are graphs of the frequency response of the lateral displacements of the E and N points of the belt, again in the test C.

The values of the concentrated parameters identified in the test C are reported in the following Table III.

TABLE III

| Parameter | Symbol | Value identified |
| --- | --- | --- |
| Residual linear stiffness | $K_{ry}$ | 665964 [N/m] |
| Residual camber stiffness | $K_{r\theta x}$ | 11461 [Nm/rad] |
| Residual linear damping | $R_{ry}$ | 2042.345 [Ns/m] |
| Residual camber damping | $R_{r\theta x}$ | 0.358 [Nms/rad] |

Figure 18:
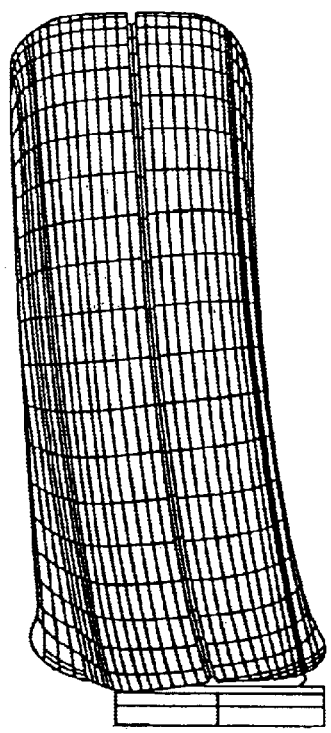
Figure 19:
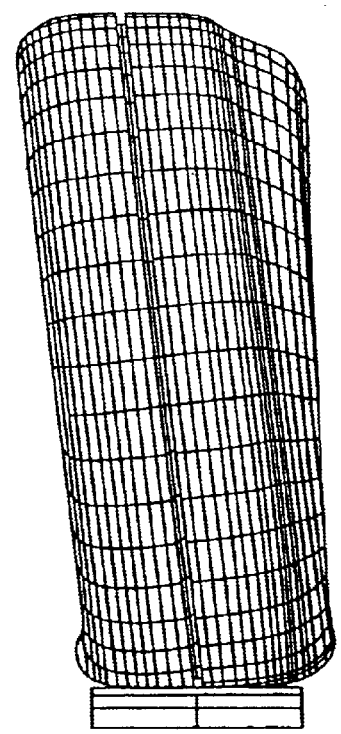

Unlike in the two earlier tests, there are two resonance peaks in this third test corresponding to two modes of vibration of the tyre depicted in FIGS. 18 and 19.

Again in this case, the modes of vibration maintain the sidewall and belt complex substantially rigid and may therefore be described accurately by the concentrated-parameter model, in other words the concentrated-parameter model is valid in the range of frequencies between 0 and 100 Hz.

The frequency responses obtained with the loads of 4,611 N and 6,302 N are not shown herein. The results, however, are similar to those shown for the 2,914 N load.

Figure 14:
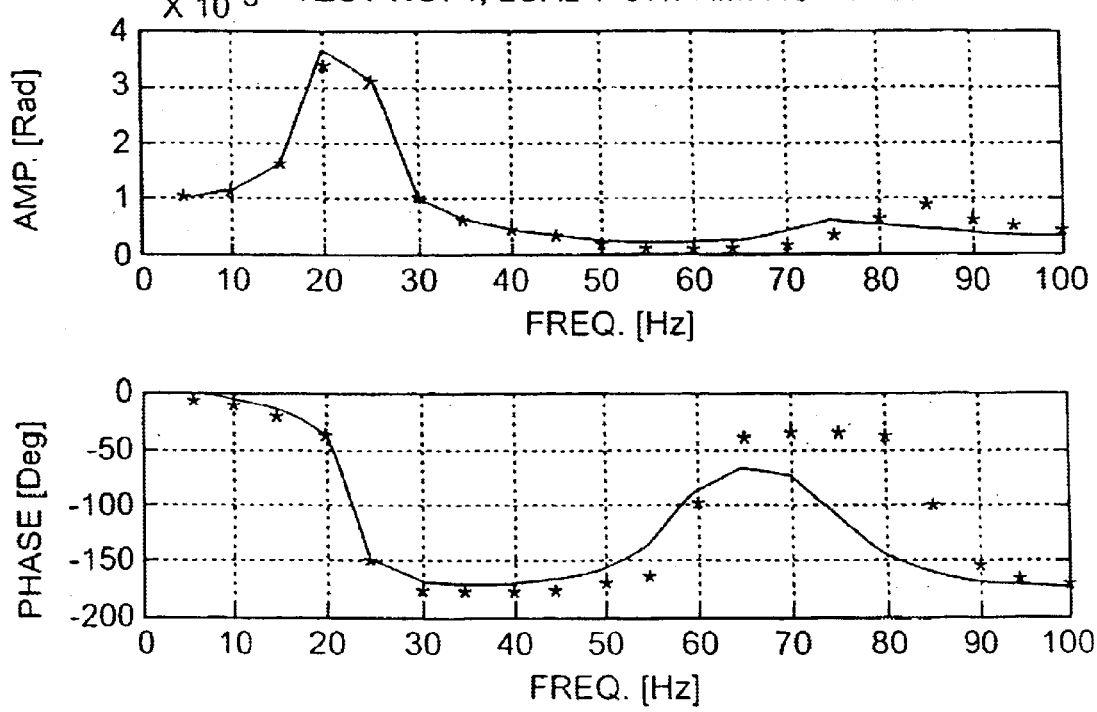

FIG. 14 is a graph of the frequency response of the yaw rotation of the hub obtained from the physical model and from the finite-element model during the test D, with a normal load of 2,914 N bearing on the tyre, whereas FIG. 15 is a graph of the frequency response of the lateral displacement of the E point of the belt, again in the test D.

The values of the concentrated parameters identified with the test D are reported in the following Table IV.

TABLE IV

| Parameter | Symbol | Value identified |
| --- | --- | --- |
| Residual yaw stiffness | $K_{r\theta z}$ | 14933 [Nm/rad] |
| Residual yaw damping | $R_{r\theta z}$ | 14.318 [Nms/rad] |

Figure 20:
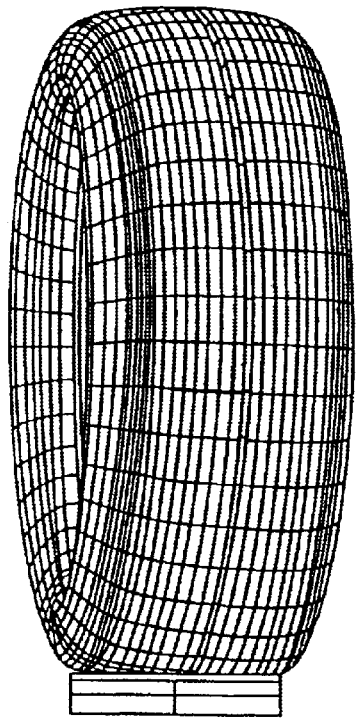
Figure 21:
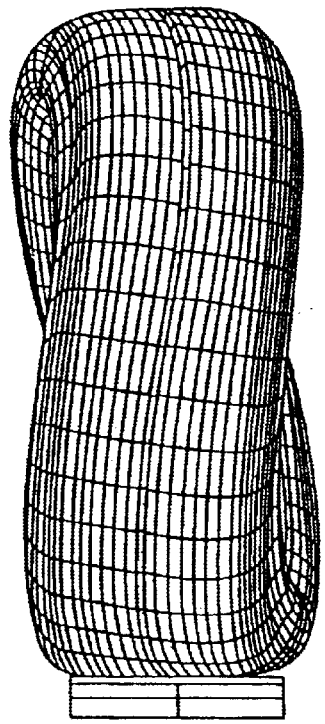

Again in the test D, there are two resonance peaks which correspond to the two modes of vibration of the tyre shown in FIGS. 20 and 21.

In this case, whereas the first mode of vibration (FIG. 20) is comparable to a rigid mode, it is much more difficult to describe the second one (FIG. 21) as a rigid mode. It seems apparent that the belt as a whole becomes deformed in this second mode of vibrating. The reconstructed frequency response does not therefore accurately reproduce the second resonance peak. The concentrated-parameter model in the test D is therefore only valid in the range of frequencies from 0 to 70 Hz.

Again in the test D, the frequency responses obtained with the loads of 4,611 N and 6,302 N are not shown herein. The results, however, are similar to those shown for the 2,914 N load.

To evaluate a tyre in relation to its road handling, verification needs to be made that the total drift stiffness $K_d$ of the tyre and the total camber stiffness $K_\gamma$ are within the following value ranges:

$K_d$=500–2,000 [N/g]

$K_\gamma$=40–3,500 [N/g]

$K_c$=8,000–30,000 [N/g]

$K_b$=150–400 [N/g]

where g=degree.

The method according to the invention enables an evaluation to be made of the steady state behaviour of the drifting tyre. The bidirectional brush model shown in FIG. 1 and illustrated above is used.

Under drift conditions, the microinserts of the brush model become deformed and a sideward force and a moment of torque act on the beam that they are connected to. These forces and moments result in a deformation of the beam that affects the configuration of the microinserts. By means of successive iterations, the deformation effectively assumed by the beams in relation to the drift angle imposed on the hub is determined. At this point, the total sideward force is determined, together with the total self-aligning torque acting on the plate that the beams are connected to. Under the total sideward force and self-aligning torque, the plate snakes by an angle that depends on the overlying structure, i.e. on the springs connecting it to the hub. On account of this snaking, the deformation of the microinserts is altered. By performing new iterations, the sideward force and self-aligning torque that the tyre summons up in reaction to the drift angle imposed are determined.

Figure 22:
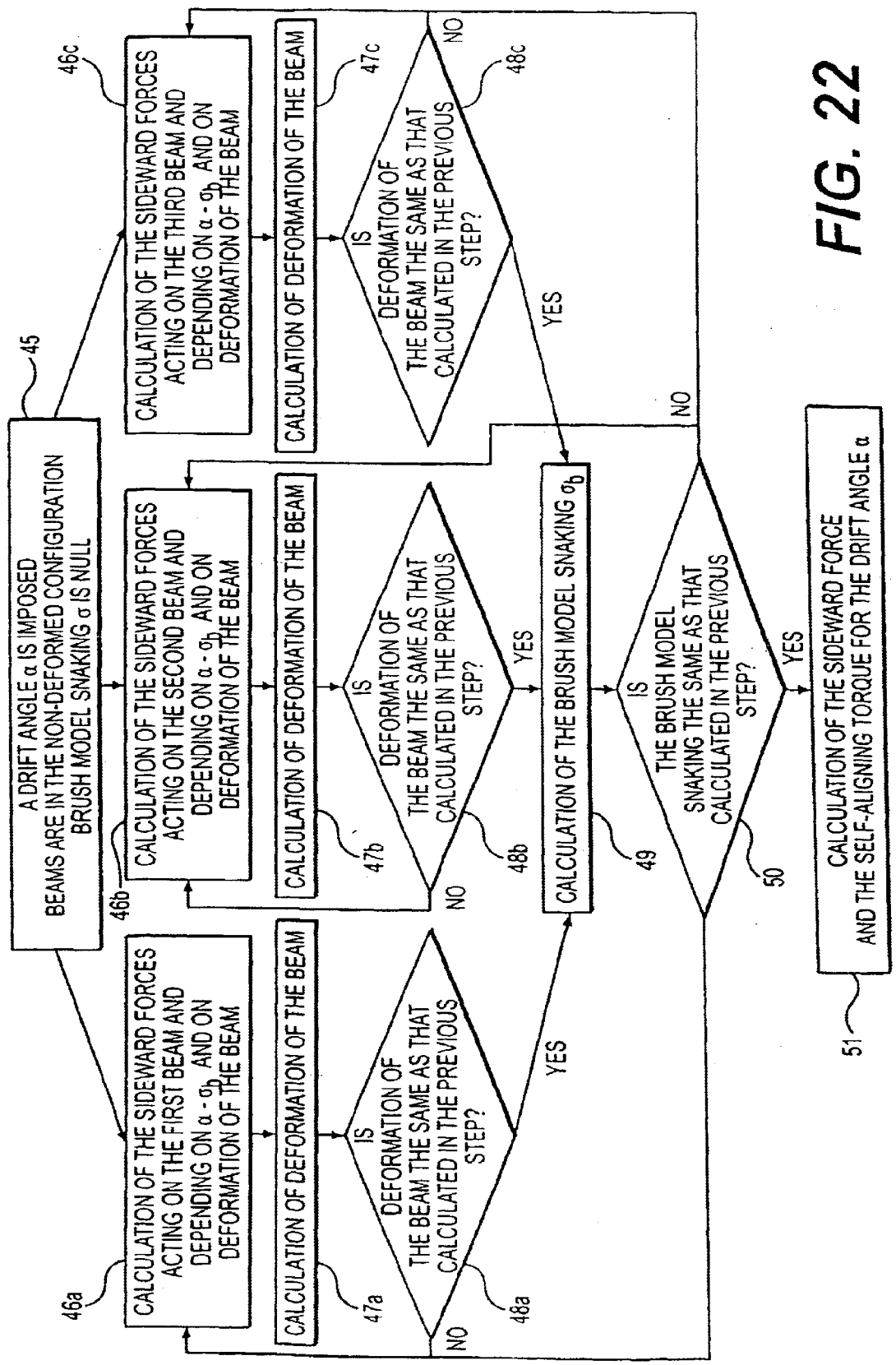
FIG. 22 is a flow diagram of a procedure for determining the steady state drift curves of the concentrated-parameter physical model of FIG. 1.

The procedure is illustrated in the flow diagram of FIG. 22.

A drift angle α is applied to the physical model 1, starting from a condition in which the beams 22 are in a non-deformed configuration and the brush model has a null snaking $\sigma_b$ (block 45). The sideward forces acting on the beams through the effect of the drift angle α and depending on the difference α–$\sigma_b$ and on the deformation of the beams are determined (blocks 46a, 46b and 46c). The deformation of the beams is determined (blocks 47a, 47b and 47c). A check is made to see if the deformation is the same as that determined in the previous step (blocks 48a, 48b and 48c). The procedure for determining deformation of the beams is repeated until deformation is verified to be equal to that found in the previous step. At this point, the snaking of the plate, i.e. of the brush model, is determined (block 49). A check is made to see if the snaking is equal to that calculated in the previous step (block 50). The procedure for determining snaking of the plate is repeated until snaking is verified to be equal to that found in the previous step. At this point, the sideward force and the self-aligning torque acting on the hub due to the drift angle imposed are determined (block 51). The procedure is repeated for the different values of the drift angle a to produce drift, force and self-aligning torque curves that enable steady state drift behaviour of the tyre to be evaluated.

The beams of the brush model do not all become deformed in the same way since the pressure distribution acting on each beam is different, as also are the sideward forces. In practice, the sidewalls of the tyre (shoulders) have greater stiffness than in the central band of the tread.

Figure 23:
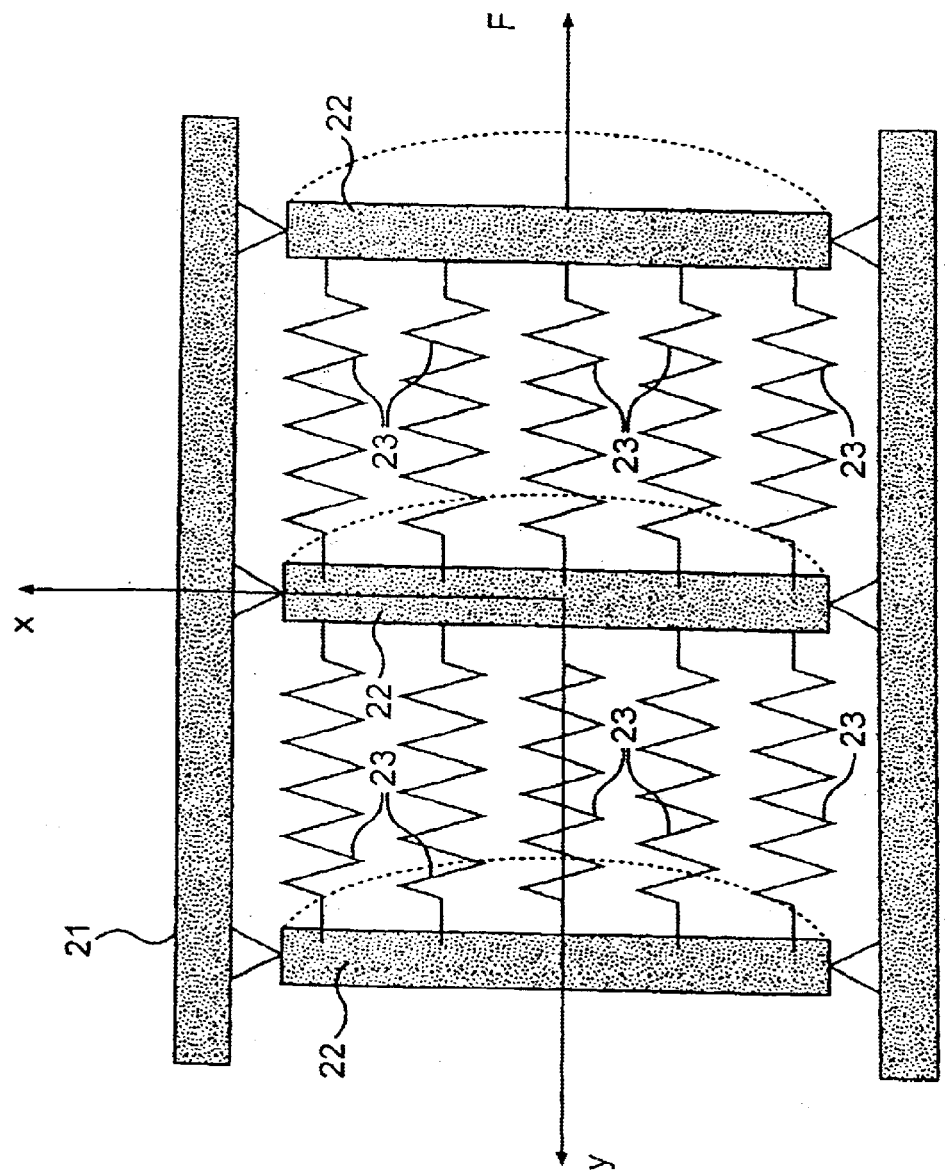
FIG. 23 is a schematic representation of a brush model associated with the concentrated-parameter physical model of FIG. 1.

To identify the flexural stiffness of each beam, a distributed parameters model is used based on a model depicted in FIG. 23 wherein the equivalent beams and springs (microinserts) of the brush model are indicated with the same numerals as in FIG. 1. A linear static analysis, corresponding to a sideways traction and made by applying a sideward force to the contact surface of the road, is then conducted on the finite-element model. The accordingly stressed tyre becomes deformed and the lateral displacements are determined at circumferential sections thereof, on a level with the external band. These circumferential sections are divided into three groups corresponding to the central part of the area of contact and to the two parts at either side. The mean lateral displacement of each group is calculated over the full length of the contact area. On determining the difference between the generic deformation mean (mean lateral displacements over the full length of the contact area) provided by the finite-element model and the lateral deformation of the rigid ring of the concentrated-parameter physical model, also subjected to the same sideward force as applied to the finite-element model, a "difference" deformation is obtained that must be offset by the equivalent beam of flexural stiffness EJ ($N*m^2$).

Knowing how the sideward force is divided over the three parts of the contact area from the linear static analysis of sideways traction on the finite-element model, a flexural stiffness EJ is determined for each beam.

In FIG. 23 it may be seen that the sections closest to the sidewall that the traction is exerted on become more deformed than those further away (dashed lines). If a load of F/3 were to be applied to each beam, there would be a monotone pattern of EJ when moving from one side of the tyre to the other, but this would be contrary to what experience shows. Therefore, using the finite-element model, a horizontal division of the load between the various sections is also made.

The results of the identification procedure are reported in the following Table V.

TABLE V

| EJ [$N*m^2$] | 1st load | 2nd load | 3rd load |
|---|---|---|---|
| 1st beam | 50 | 120 | 250 |
| 2nd beam | 45 | 106 | 210 |
| 3rd beam | 50 | 120 | 250 |

To describe as accurately as possible what happens in the area of contact between tyre and road, the actual pressure distribution in this area must be determined.

Figure 24:
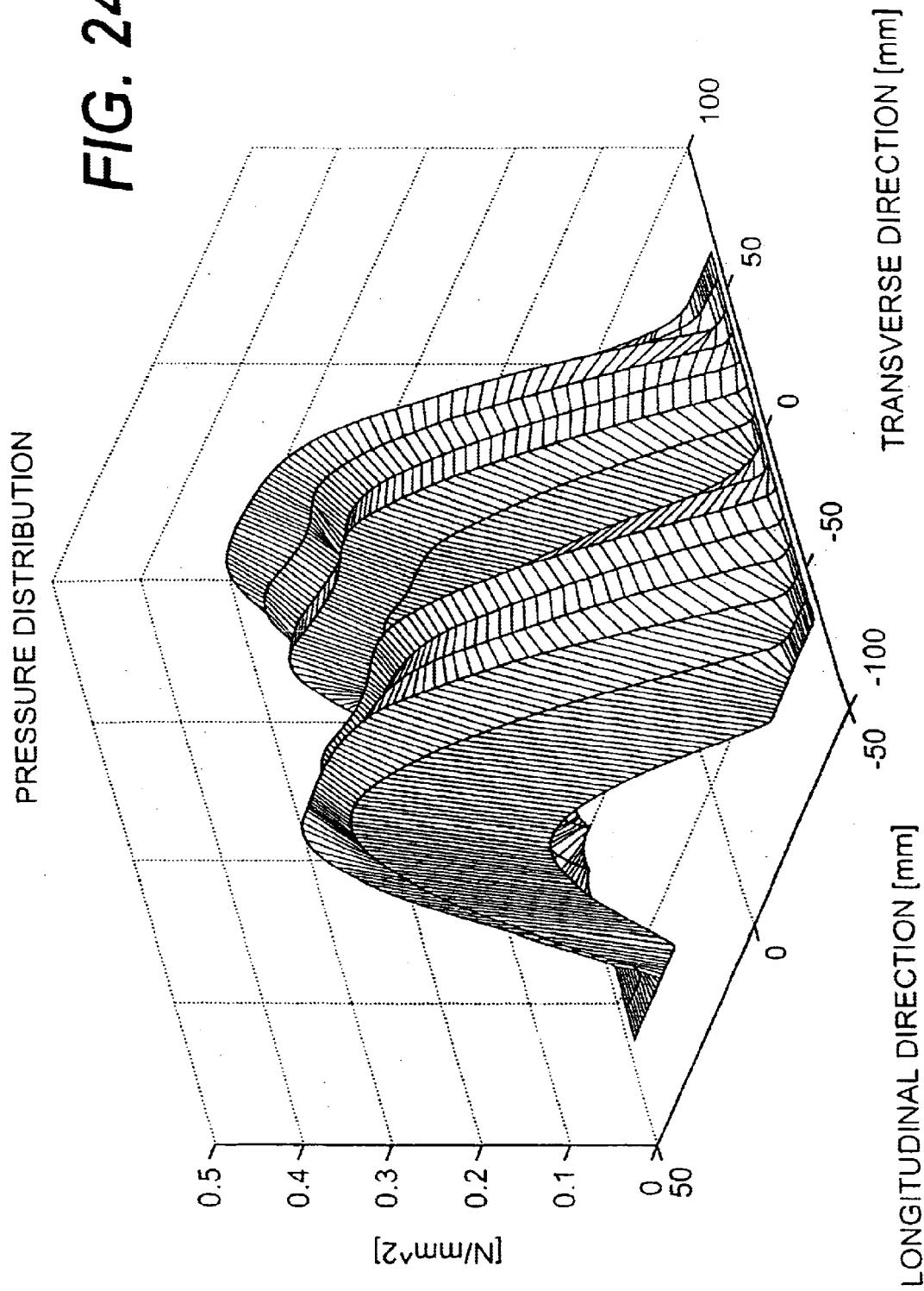
FIG. 24 depicts a contact pressure distribution determined using the finite-element model describing the selected real tyre.

Using the finite-element model, a static pressure distribution is determined on a non-rolling tyre with no drift. The pressure distribution determined under a 55 range tyre, quoted earlier, is illustrated in FIG. 24, with a normal acting load of 2,914 N. Similar distributions were determined with normal loads of 4,611 N and 6,302 N.

It may be seen that two pressure peaks are presented in the transverse direction and that these peaks are shifted outwardly with respect to the centre of the area of contact. Furthermore the distribution in the longitudinal direction is symmetrical. Finally the ratio of the maximum value to the minimum value of the pressure along the transverse direction increases as the normal load increases.

To obtain the drift curves, the pressure values in those points where the microinserts of the brush model are present must be known beforehand. The contact was represented in the concentrated-parameter physical model by means of a-regular grid of 200×15 elements (200 elements longitudinally and 3×5 elements transversally). Accordingly, the pressure at the nodes of this grid must be known, i.e. at 3,000 points. The finite-element model provides the pressure at a much lower number of points arranged in an irregular grid. A procedure for the interpolation of the finite-element model data is used to move from the grid of points provided by the finite-element model to that required by the concentrated-parameter model. In the case in hand, the procedure adopted is that of the "inverse distances". This interpolation procedure requires the following inputs:

the coordinates of those points at which the pressure is known;

the value of the pressure at these points;

the coordinates of the points for which the interpolated pressure value is required.

The procedure provides the pressure value for the points required.

Figure 25:
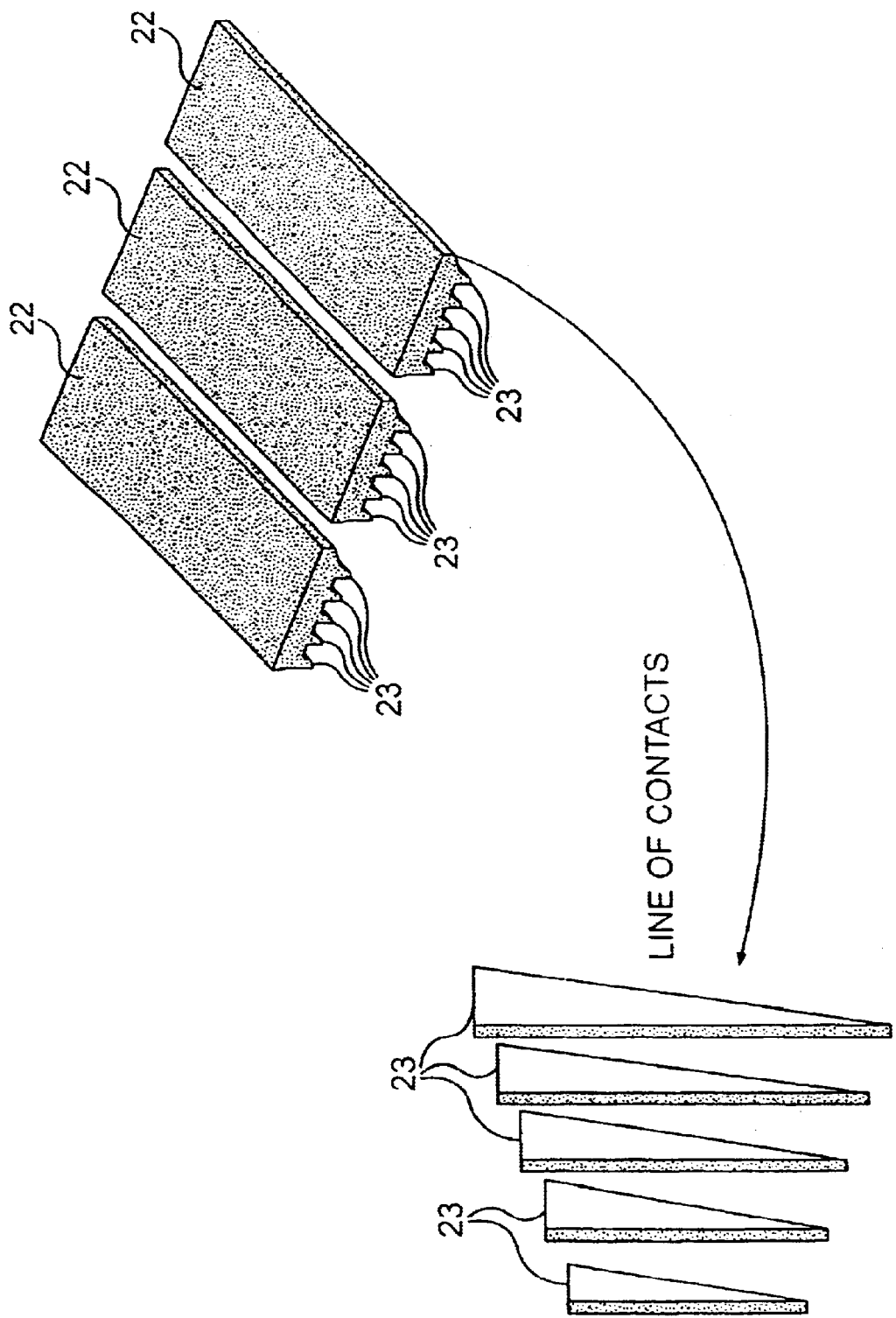
FIG. 25 shows details of the brush model of FIG. 1.
Figure 26:
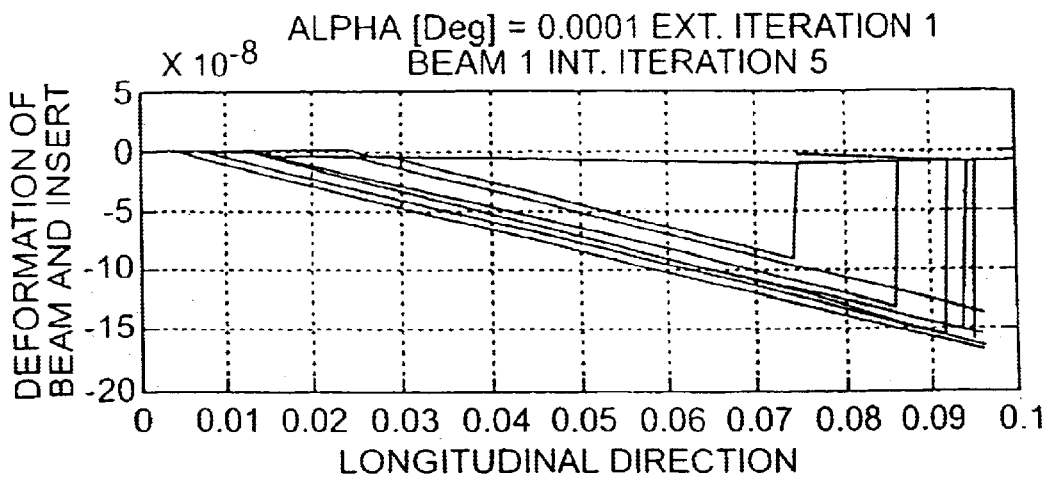
FIGS. 26 and 27 are graphs illustrating the results obtained with the brush model of FIG. 1.
Figure 27:
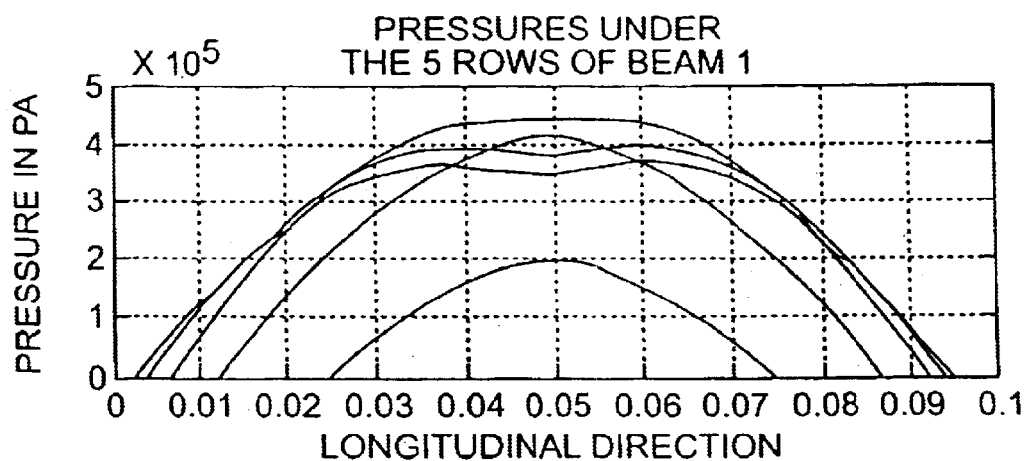

Downstream of the identification stage, it is required that any negative pressure values be equal to zero. Accordingly the actual shape of the area of contact can be reproduced extremely accurately as each microinsert of the brush model has an own length and a known pressure distribution. More specifically, the length of the contact of each microinsert changes upon variation of the transversal position considered and each microinsert has an own pressure value that depends on its position within the contact. Therefore the curve of the contacts of each microinsert, which identifies the position of the bottom ends of the microinserts when the tyre is drifting, varies from one microinsert to the next. When the wheel is set rolling and drifting, and a beam and the five rows of microinserts under it are considered, it may be seen that the microinserts undergo a progressive, linearly increasing deformation. The range of deformations is therefore triangular, in the passage from entrance to exit of the footprint area, assuming there is no slipping (FIG. 25). FIG. 26 illustrates the deformation undergone by the beam due to the effect of the sideward forces transmitted by the microinserts and the deformations undergone by the microinserts. The deformations of the microinserts are given by the relative displacements between the upper ends (attached to the beam) and the lower ends (located on the line of contacts in the event of adhesion). Pattern of the pressure in each microinsert is illustrated in FIG. 27.

In order to determine the lateral and torsional stiffness per unit of length of the microinsert, respectively $\tilde{c}_p$ and $\tilde{k}_{tor}$, the total stiffnesses of the whole tread are taken and then the values found are divided by the total length of the microinserts obtained as the sum of those of the single microinserts:

$$\begin{cases} \tilde{c}_p = \dfrac{2 \cdot a \cdot c_{py}}{l_{tot}} \\ \tilde{k}_{tor} = \dfrac{2 \cdot a \cdot k_{tor}}{l_{tot}} \end{cases} \quad (1.43)$$

where $2a$ is the length of the area of contact, $l_{tot}$ is the sum of the lengths of the single microinserts, $c_{py}$ is the stiffness per unit of length of the contact and $k_{tor}$ is the torsional stiffness per unit of length of the contact.

These values are used to obtain the drift curves.

To determine the torsional contribution of the microinserts in the yaw test with a non-rolling tyre, the flexure of the inserts present in the footprint area of the concentrated-parameter model is identified, the sum is obtained of the contributions of each and the value obtained subtracted from the torque per foot provided by the finite-element model. The shape of the area of contact is provided by the finite-element model. In this way, the purely twisting torque arising following rotation about the Z axis of the tyre pressed to the ground is obtained.

The sideward force produced following deformation of each microinsert and contributing to the flexure, assuming perfect adhesion, is equal to the lateral stiffness of the microinsert multiplied by the relative displacement in the plane of the contact of the top end with respect to the bottom end of the microinsert. Assuming a rotation about the centre of contact and perfect adhesion, the deformation of a generic microinsert is equal to d (x, y)*α', where α' is the rotation about the Z axis effectively undergone by the tread and d is the distance of the microinsert taken from the centre of the contact.

The lateral stiffness of the single microinsert is determined starting from the stiffness per unit of length of the contact:

$$\overline{c_p} = \frac{2 \cdot a \cdot c_{py}}{4 \cdot a \cdot b} \cdot dx \cdot dy \tag{1.44}$$

where a is the half-length of the contact, b is the half-width of the contact and dx and dy are respectively the longitudinal and transversal dimensions of each microinsert.

The bending torque due to each microinsert is calculated as follows:

$$M_f(x,y) = F(x,y) \cdot d(x,y) \tag{1.45}$$

where F is the sideward force due to the flexure of the microinsert and x and y are the coordinates as measured from the centre of the contact.

The total bending torque created under the area of contact for the rotation α' is calculated as follows:

$$M_f = \sum_x \sum_y M_f = \sum_x \sum_y F(x,y) \cdot d(x,y) = \sum_x \sum_y \overline{c_p} \cdot \alpha' \cdot d^2(x,y) \tag{1.46}$$

By subtracting the total bending torque from the torque per foot provided by the finite-element model, the pure twisting torque is obtained:

$$M_{tors} = C_{foot} - M_f \tag{1.47}$$

If the twisting torque is divided by the rotation α' and by the length of the area of contact 2a, the torsional stiffness per unit of length of the contact is obtained:

$$K_{tor} = \frac{M_{tors}}{2 \cdot a \cdot \alpha'} \tag{1.48}$$

With the method according to the invention making allowance for the deformability of the structure of the concentrated-parameter model, of the local deformations of the contact through the equivalent beams, of the lateral and torsional stiffnesses of the microinserts, the drift curves for the range 55 tyre were determined for three different loads.

To obtain calculated drift curves coinciding with the experimental ones, the shape of the area of contact is considered.

Figure 28:
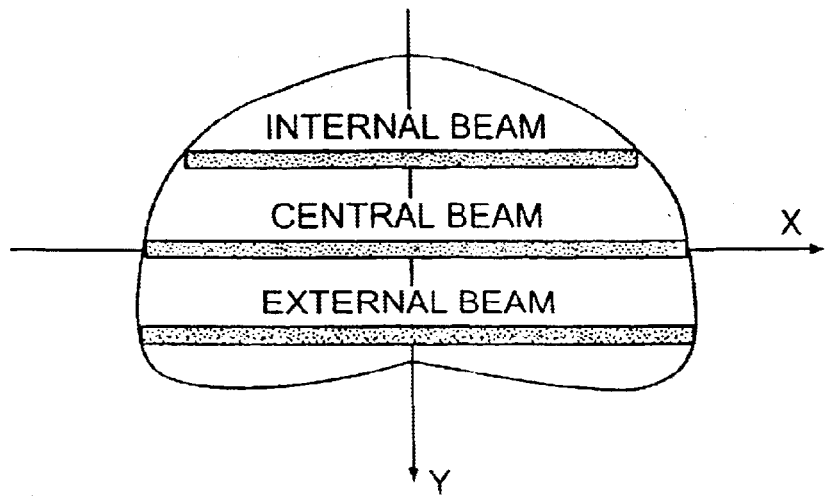
FIG. 28 shows schematic representations of the brush model of FIG. 1.

Bearing in mind the local deformation of the belt in correspondence with the area of contact, a pear-shaped area of contact is identified and a brush model with equivalent beams of different lengths is used, as depicted in FIG. 28. The length of the beams is obtained by performing a sensitivity analysis, assuming that the central beam is equal in length to the statistically measured contact area length and that the variation of length of the external and internal beams is of equal modulus, but opposite sign. The sensitivity analysis was conducted on the range 55 tyre.

It was found that the shape of the area of contact affects the transversal pressure distribution: the pressure peak corresponding to the outside of the curve is no longer equal to the other one (the external pressure peak increases, whereas the internal one decreases as the drift angle increases). It is considered that the pressure distribution in the transverse direction is always less symmetrical with a higher pressure peak in correspondence with the longest equivalent beam and a lower pressure peak in correspondence with the shortest equivalent beam.

Figure 29:
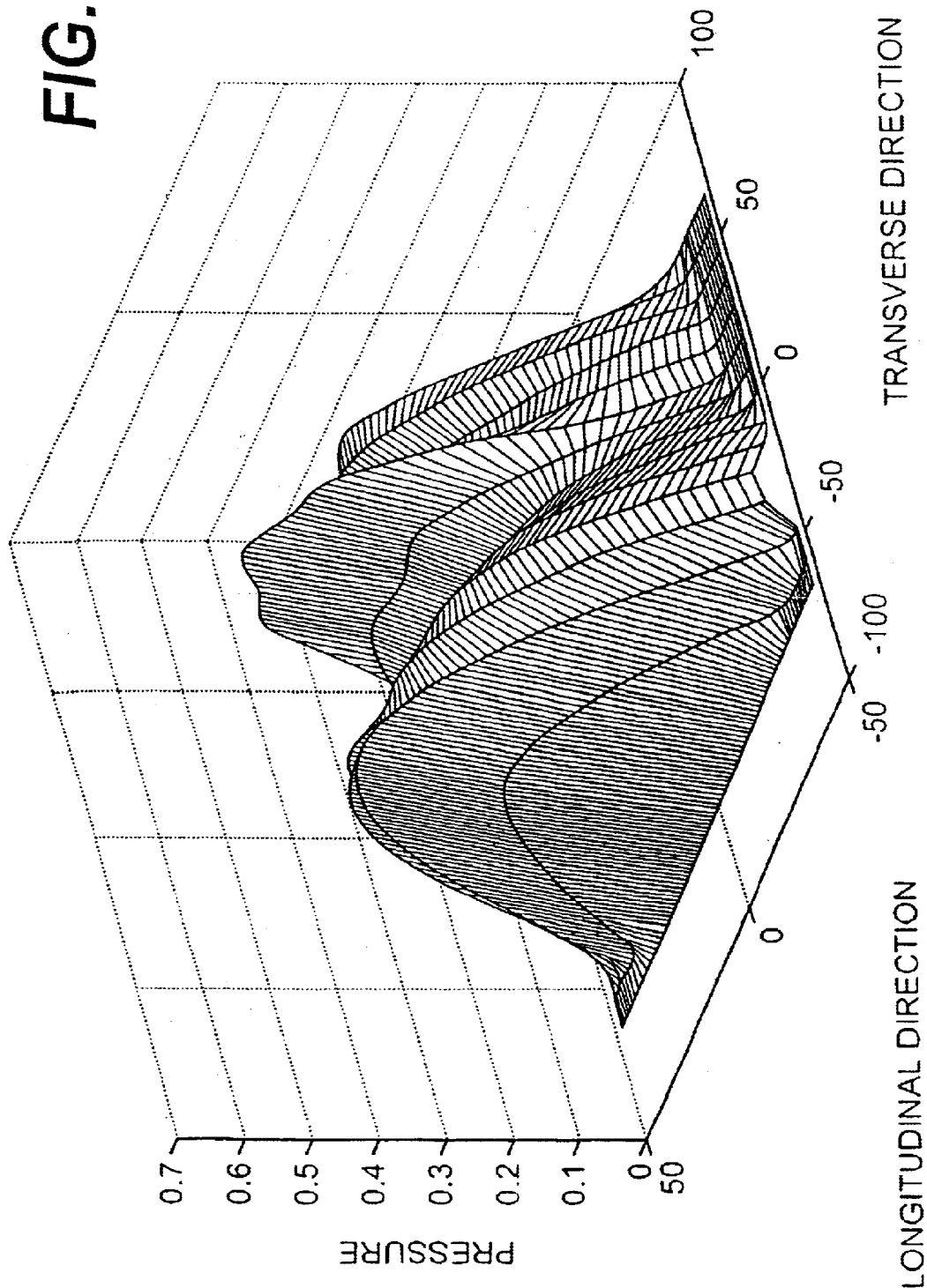
FIG. 29 depicts another contact pressure distribution determined using the finite-element model describing the selected real tyre.
Figure 30:
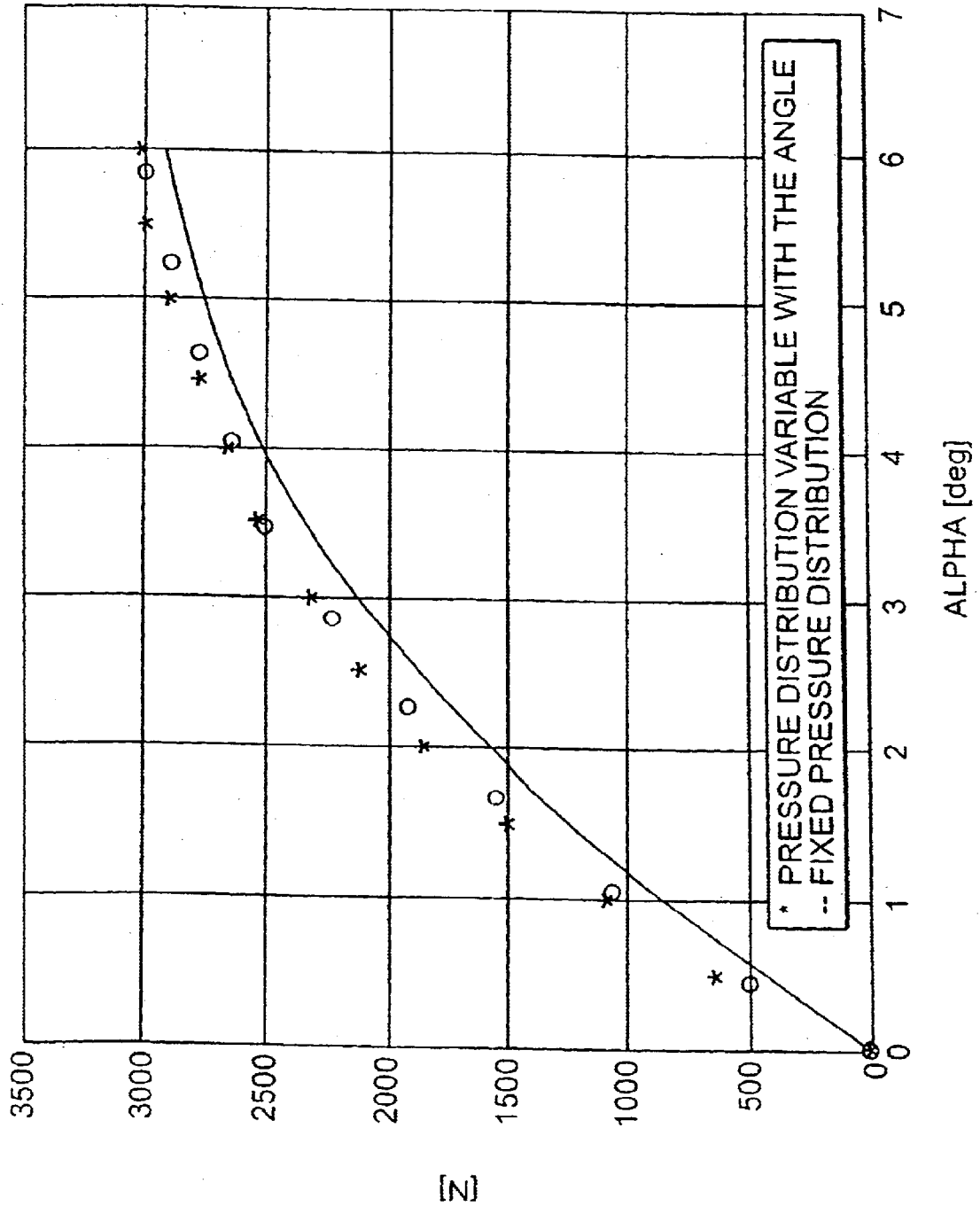
FIGS. 30 and 31 are drift curves obtained from the concentrated-parameter physical model describing the selected real tyre.
Figure 31:
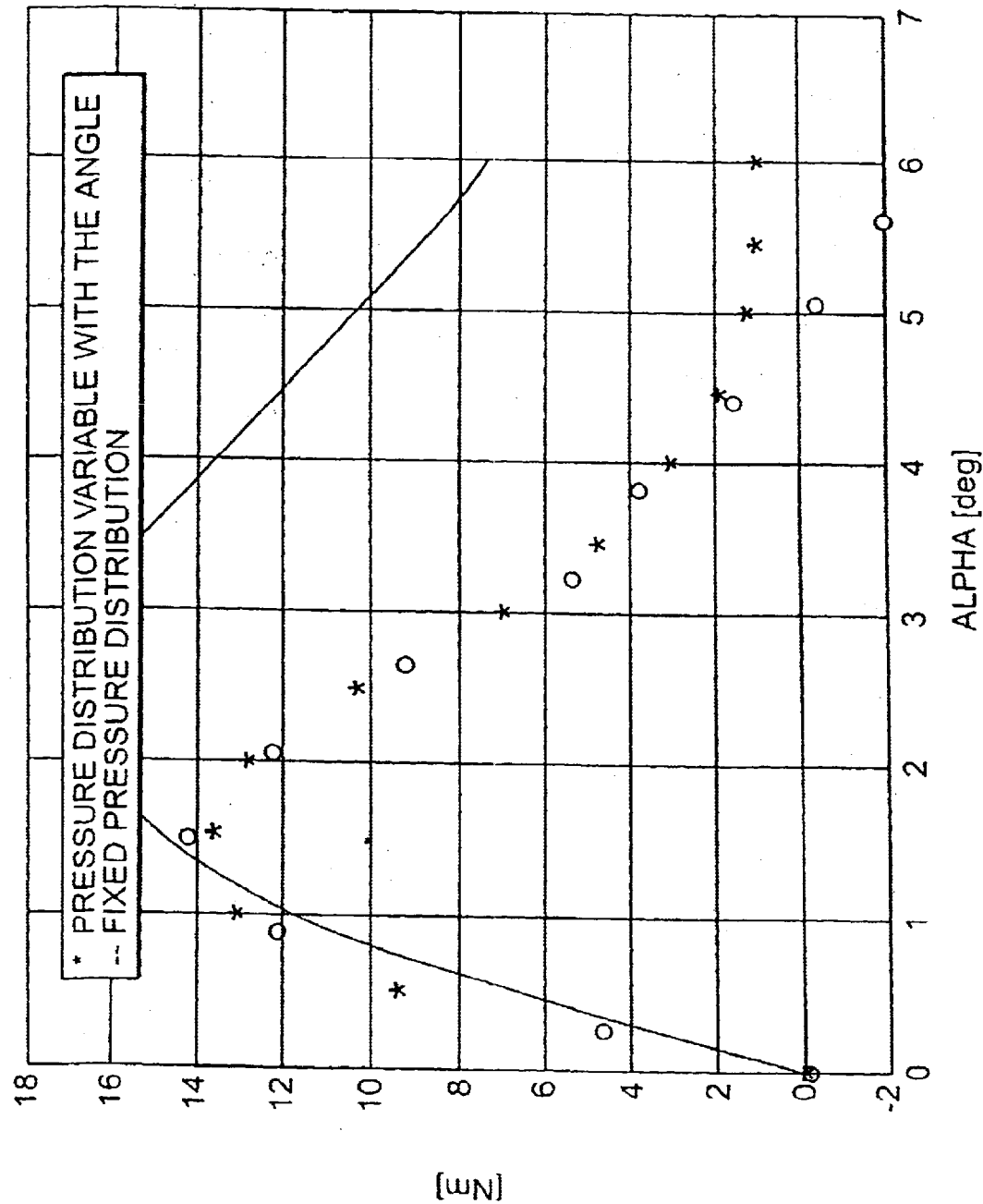

For an indication of the pattern of the distribution of pressure from the finite-element model, the sideward forces arising under the contact are calculated for different drift angles through the concentrated-parameter physical model as described earlier. This force distribution is applied to the nodes of the finite-element model (non-rolling) in contact with the ground and an extremely realistic indication of the pressure distribution in the area of contact obtained. From the pressure distributions obtained, a strong symmetry in the transverse direction results. Illustrated in FIG. 29 is the pattern of pressure distribution ($N/mm^2$) for a vertical load of 2,914 N whenever a sideward force and a self-aligning torque corresponding to a test with drift of 6° are applied to the finite-element model. On application of these new data to the concentrated-parameter physical model, calculated drift, sideward force and self-aligning torque curves are obtained that are practically coincident with those obtained by experimental means. FIGS. 30 and 31 illustrate respectively the pattern of the sideward force (N) and the self-aligning torque (Nm) in relation to the drift angle α (°) for a vertical load of 2,914 N. The calculated values are marked with asterisks (*), whereas the experimental values are marked with circles (o). Similar curves were obtained for normal loads of 4,611 N and 6,302 N.

To determine the dynamic behaviour of the drifting tyre during the transient state, the tyre is made roll by imposing laws of motion on the hub that vary with time and are suitable for numerically reproducing selected experimental tests commonly carried out on tyres.

Two experimental tests are conducted in the laboratory for evaluating the dynamic behaviour of a drifting tyre:

a first test called pendulum test, consisting in simultaneously imposing a lateral displacement and a steering angle on the hub of the tyre;

a second test called drift test with yaw pattern, consisting in directly imposing a drift angle equal to the yaw angle imparted to the hub, In both of the experimental tests, a wheel-road that simulates the ground is used. The tyre is blown up and pressed to the wheel-road which is rotating at constant angular speed. The axis of the tyre is made oscillate, and a drift angle that varies with time induced upon it. The oscillations are imposed on the wheel with the two test arrangements described above.

Figure 32:
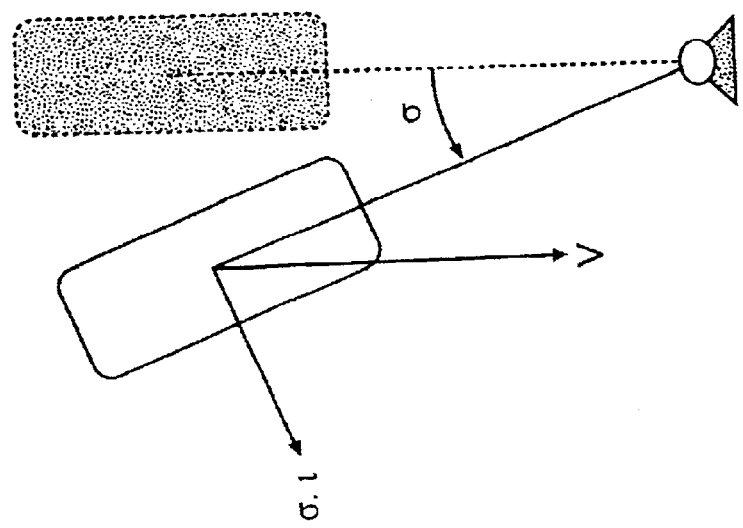

FIG. 32 illustrates a cinematic diagram of a test machine with the pendulum arrangement. By adopting a reference system integral with the hub of the wheel, the longitudinal and transverse components are defined of the velocity of the centre of the area of footprint determined by the rotation velocity V imparted to the tyre by the wheel-road.

$$V_T = \sigma \cdot l + V \cdot \sin(\sigma)$$

$$V_L = V \cdot \cos(\sigma) \tag{1.49}$$

from which the drift angle α is obtained for small values of the angle of pendulum (steering) σ:

$$\alpha \cong \frac{\dot{\sigma} \cdot l + V \cdot \sigma}{V} = \sigma + \frac{\dot{\sigma}}{V} \cdot l \quad (1.50)$$

If a motion that is, for instance, sinusoidal is imposed on the pendulum:

$$\sigma = \sigma_0 \cdot \cos(\Omega \cdot t) \quad (1.51)$$

the drift angle becomes:

$$\alpha = \sigma_0 \cdot \cos(\Omega \cdot t) - \frac{\Omega \cdot \sigma_0}{V} \cdot l \cdot \sin(\Omega \cdot t) = \sigma_0 \cdot (\cos(\Omega \cdot t) + \varphi) \quad (1.52)$$

Therefore, the drift angle $\alpha$ is equal to the steering angle $\sigma$ imposed on the hub, with a phase difference of angle $\phi$. If $\sigma$ is constant, then $\alpha$ is always=$\sigma$.

Figure 33:
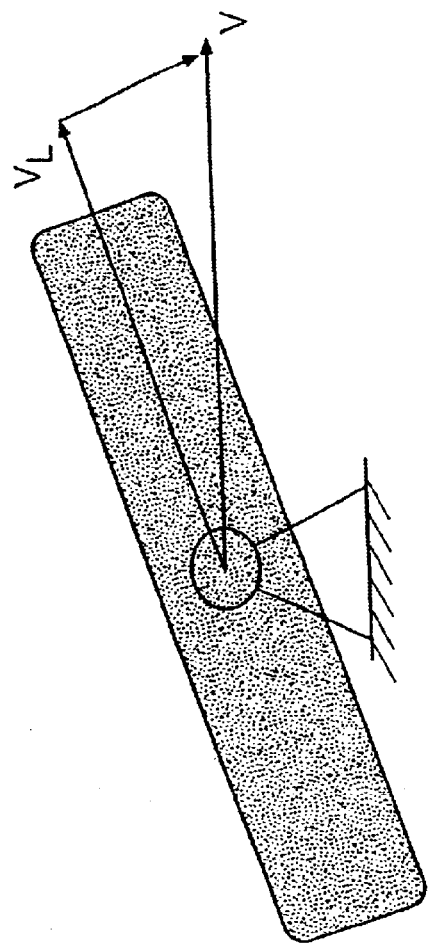
FIGS. 32 and 33 are schematic representations of drift transient state test procedures to which the concentrated-parameter physical model of FIG. 1 is subjected.

FIG. 33 illustrates a cinematic diagram of a test machine with the yaw arrangement. The longitudinal and transverse components of the velocity of the centre of the hub are defined as follows:

$$\begin{cases} V_L = V \cdot \cos(\sigma) \\ V_T = V \cdot \sin(\sigma) \end{cases} \quad (1.53)$$

The resultant drift angle for low snaking angles imposed on the hub is:

$$\alpha = \frac{V \cdot \sin(\sigma)}{V \cdot \cos(\sigma)} \cong \sigma \quad (1.54)$$

Again in this case the steering angle imposed on the hub is equal to the drift angle.

To determine the equations of motion of the tyre under dynamic conditions, suitable for reproducing the two experimental tests described above, the absolute, right-handed trio of reference axes shown in FIG. 1 is adopted. The horizontal X axis, orthogonal to the axis of rotation of the hub, forms a null steering angle $\sigma$m. In the numerical simulations it is assumed that it is the hub that moves while the wheel-road remains motionless. The microinserts of the brush model enter the area of contact and their bottom ends remain attached to the ground until slipping occurs.

The independent variables of the physical model 1 with nine degrees of freedom are again those indicated above (1.1). The equations of motion governing the motion of the physical model are again those in matrix form reported above (1.7). The matrix of mass and that of stiffness are those reported above at (1.4) and (1.5). The damping matrix is that given above at (1.6), wherein the terms (5,3), (5,6) and (6,5) are equal to $J_{y\omega y}$ (moment of inertia and angular speed about the Y axis) to take gyroscopic effects into account.

The vector of the forces comprises:
the force $F_{by}$ and the torque $M_{bz}$ transmitted by the microinserts to the structure of the tyre and a function of time; the resulting sideward force $F_{by}$ is positive if orientated similarly to the Y axis and the self-aligning torque $M_{bz}$ is positive if orientated similarly to the Z axis;
the force $F_{my}$ and the torques $M_{mx}$ and $M_{mz}$ transmitted by the test machine to the hub;
the torque $M_{bx}$ constraining the plate not to rotate about the X axis because such a degree of freedom is not included since a monodimensional brush model is used.

$$\underline{F} = \{F_{my} M_{mx} M_{mz} 0 0 0 F_{by} M_{bx} M_{bz}\}^T \quad (1.55)$$

For the case under examination, in the concentrated-parameter physical model in the transient state, the yaw test is simulated by stating:

$$y_m = \rho_m = 0$$
$$\sigma_m = \sigma_m(t) \quad (1.56)$$

Then the three free coordinates of the hub are constrained in the model whereas the roll of the brush model is not taken into consideration since the contact is considered to be monodimensional.

A partition is made between the generalized $\underline{x}_l$ and constrained $\underline{x}_v$ degrees of freedom:

$$\underline{x} = \{\underline{x}_l^T \underline{x}_v^T\}^T = \{\{y_c \rho_c \sigma_c y_b \rho_b\} \{y_m \rho_m \sigma_m \sigma_b\}\}^T \quad (1.57)$$

and the matrices of mass, stiffness and damping are accordingly rearranged by performing a division into four submatrices so as to obtain two matrix equations from the equations of motion:

$$\begin{cases} [M_{ll}]\ddot{x}_l + [M_{lv}]\ddot{x}_v + [R_{ll}]\dot{x}_l + [R_{lv}]\dot{x}_v + [K_{ll}]x_l + [K_{lv}]x_v = \underline{F}_l \\ [M_{vl}]\ddot{x}_l + [M_{vv}]\ddot{x}_v + [R_{vl}]\dot{x}_l + [R_{vv}]\dot{x}_v + [K_{vl}]x_l + [K_{vv}]x_v = \underline{F}_v \end{cases} \quad (1.58)$$

In the first equation, $\underline{F}_l$ represents the vector containing the external active forces acting on the actual degrees of freedom; in this case, the only external forces acting on the $\underline{x}_l$ are the sideward force $F_{by}$ and the self-aligning torque $M_{bz}$ created under the contact and acting on the degrees of freedom of the plate. These forces depend on the arrangement of deformation of the inserts and on whether or not there is local slipping; they are therefore, generally speaking, non-linear functions of the degrees of freedom. In the second equation, $\underline{F}_v$ represents the vector of the generalized reactions applied to the constrained degrees of freedom.

Remembering that the vector $\underline{x}_v$ and its derivatives with respect to time are vectors of known functions, the first equation may be rewritten as follows:

$$[M_{ll}]\ddot{x}_l + [R_{ll}]\dot{x}_l + [K_{ll}]\underline{x}_l = \underline{F}_l - [M_{lv}]\ddot{x}_v - [R_{lv}]\dot{x}_v - [K_{lv}]\underline{x}_v = \hat{\underline{F}} \quad (1.59)$$

wherein the terms $\hat{\underline{F}}$ are all known because they are the sum of the effective external forces and of the equivalent forces due to the motion imparted to the constraints.

The equation (1.59) therefore represents a system of "n" equations, one for each unknown $\underline{x}_l$; by solving this equation, the motion $x_l$ of the model can be determined.

Once the equations (1.59) have been integrated and the values obtained for $x_l$ and their derivatives, the constraining reactions $\underline{F}_v$ may be obtained from the equations for the constrained degrees of freedom.

To solve the non-linear equations (1.59) with explicit numerical methods, the procedure is to invert the matrix of mass $[M_{ll}]$ and, as the matrix is singular and cannot therefore be inverted, the equation (1.59) is rewritten as a first order system. A further partition is then made, followed by a change of variables.

The selected partition of $\underline{x}_1$ (1.57) is:

$$\underline{x}_l = \{y_c \rho_c \sigma_c y_b \sigma_b\}^T = \{\{y_c \rho_c \sigma_c\}\{y_b \sigma_b\}\}^T = \{\underline{x}_c^T \underline{x}_b^T\}^T \quad (1.60)$$

On rearranging the already rearranged matrices of mass, stiffness and damping as described above, and performing a division into four submatrices, the equation (1.59) becomes:

$$\begin{cases} [M_{cc}]\ddot{x}_c + [R_{cc}]\dot{x}_v + [R_{cb}]\dot{x}_b + [K_{cc}]x_c + [K_{cb}]x_b = \hat{F}_c \\ [R_{bc}]\dot{x}_c + [R_{bb}]\dot{x}_b + [K_{bc}]x_c + [K_{bb}]x_b = \hat{F}_b \end{cases} \quad (1.61)$$

where $\hat{F}_c$ is a vector of three elements containing the generalized forces acting directly on the degrees of freedom of the belt and $\hat{F}_b$ is a vector of two elements containing the generalized forces acting directly on the degrees of freedom of the brush model ($F_{by}$ and $M_{bz}$).

Finally, to obtain a first order system, an auxiliary identity is added to the system (1.61):

$$\begin{cases} [M_{cc}]\ddot{x}_c + [R_{cc}]\dot{x}_v + [R_{cb}]\dot{x}_b + [K_{cc}]x_c + [K_{cb}]x_b = \hat{F}_c \\ [R_{bc}]\dot{x}_c + [R_{bb}]\dot{x}_b + [K_{bc}]x_c + [K_{bb}]x_b = \hat{F}_b \\ [M_{cc}]\dot{x}_c = [M_{cc}]\dot{x}_c \end{cases} \quad (1.62)$$

and the following change of variables is made:

$$z = \{\dot{x}_c^T x_c^T x_b^T\}^T = \{\{\dot{y}_c \dot{\rho}_c \dot{\sigma}_c\}\{y_c \rho_c \sigma_c\}\{y_b \sigma_b\}\}^T \quad (1.63)$$

If the matrices [B] and [C] are defined:

$$[B] = \begin{bmatrix} [M_{cc}] & [0] & [R_{cb}] \\ [0] & [0] & [R_{bb}] \\ [0] & [M_{cc}] & [0] \end{bmatrix}$$

$$[C] = \begin{bmatrix} [R_{cc}] & [K_{cc}] & [K_{cb}] \\ [R_{bc}] & [K_{bc}] & [K_{bb}] \\ -[M_{cc}] & [0] & [0] \end{bmatrix} \quad (1.64)$$

the system (1.62) is synthetically expressed as:

$$[B]\dot{z} + [C]z = \hat{F} \quad (1.65)$$

where $\hat{F}$ is a vector of eight elements comprised as follows:

$$\hat{F} = \{\hat{F}_c^T \hat{F}_b^T 000\}^T \quad (1.66)$$

The matrix [B] is now invertible. These dynamic equations are numerically integrated a Runge-Kutta step-by-step method of the 3$^{rd}$ order.

In the equations (1.65), the matrices [B] and [C] are defined whilst the vector of the forces still needs to be identified, in particular $F_{by}$ and $M_{bz}$ created under the rolling tyre in transient state.

As already stated earlier, to describe the behaviour of the rolling tyre in the transient state, a component of displacement V*t in the X direction is imposed on the centre of the hub. In the drift test with yaw arrangement, small variations of the degrees of freedom are imposed on the physical model. Under these conditions, the deformation modalities of the microinserts inside the area of contact differ from those under steady state conditions. An insert enters the area of contact in a generic position that depends on the motion of the wheel and its deformation in the contact area changes with time in a manner dictated by the pattern of the model's degrees of freedom. The forces arising during the transient state depend on the trajectory of the top and bottom ends of each microinsert and are, as stated, influenced by the motion of the wheel. The deformation of a generic i-th microinsert is defined as follows:

$$Y_{i\_T}(x_i, t) - Y_{i\_P}(x_i, t) \quad (1.67)$$

where $Y_{i\text{-}p}$ is understood to be the absolute lateral displacement of the top end of the i-th microinsert connected to the plate and $Y_{i\text{-}T}$ is understood to be the absolute lateral displacement of the bottom end interacting with the ground.

Figure 34:
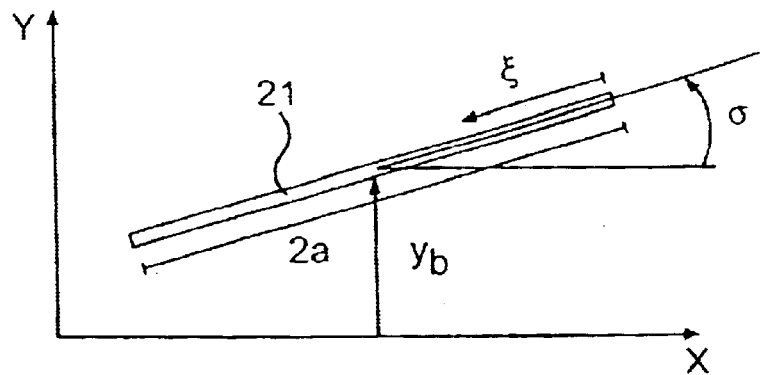
FIGS. 34, 35 and 36 are further schematic representations of the brush model of FIG. 1.
Figure 35:
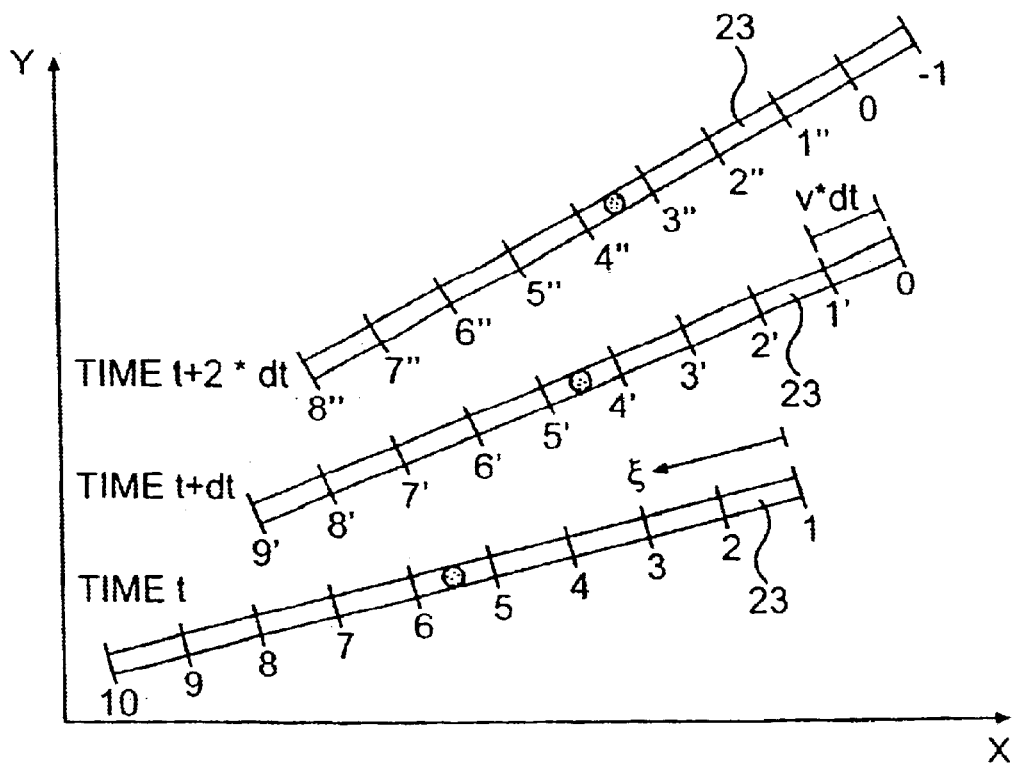

A procedure enabling an instant-by-instant evaluation of the displacements of the top and bottom ends of all the microinserts in the contact is now illustrated with reference to FIGS. 34 and 35. The plate 21 of FIG. 1, connecting the belt to the microinserts in a generic configuration, is illustrated in schematic form, seen from above, in FIG. 34. Having earlier indicated the absolute lateral displacement of the plate with $Y_b$ and its absolute yaw with $\sigma_b$, the absolute lateral displacement of the top end of the generic microinsert $Y_{i\text{-}p}$ is:

$$Y_{i\_P}(x_i, t) = Y_b(t) + (a - \xi_i) \cdot \sin(\sigma_b) \quad (1.68)$$

where $\xi_i$ is the abscissa indicating the generic microinsert in the reference integral with the wheel (FIG. 34).

The position must now be identified of the bottom ends of the microinserts $Y_{i\text{-}T}$ in order to determine their deformation and accordingly obtain the contact forces.

A generic microinsert is taken at the generic instant of time at which it enters the contact area: the top and bottom ends, seen from above, are at the same point because the microinsert has not yet been deformed. In the successive instant, the top end of the generic microinsert has a longitudinal displacement component V*t opposite to the feed direction of the tyre while, at the same time, due to the effect of a the absolute lateral displacement of the plate $y_b$ and of its yaw $\sigma_b$, it also has a transverse direction component. Simultaneously, the bottom end of said microinsert, assuming perfect adhesion, remains motionless in the absolute reference system whereas, in the reference system integral with the wheel, it possesses a displacement component V*t in the longitudinal direction. Having set a distance between two adjacent microinserts of V*dt in correspondence with each step of integration of the dynamic equations described above, a single microinsert enters and exits from the contact (FIG. 35). Three successive instants of time are taken. At the instant t, the microinsert 1 has just entered under the contact and is in the deformed configuration. An instant later, the top end of the microinsert 1 has gone into 1' having a vertical coordinate $\xi = V*dt$, whereas the bottom end has remained in 1. Simultaneously, the non-deformed microinsert 0 comes under the contact. The position occupied by the bottom end of the microinsert 1'' (which is the third microinsert in the local reference) at the time t+2*dt is the same as occupied by the bottom end of the microinsert 1' an instant earlier. In the same way, the position occupied by the bottom end of the microinsert 2'', the fourth in the local reference, at the time t+2*dt is the same as that occupied by the microinsert 2' an instant earlier. The position occupied by the bottom end of the generic microinsert at the time t is:

$$Y_{i\_T}(x_i, t) = Y_{i\_T}(x_{i-1}, t - dt) \quad (1.69)$$

Figure 36:
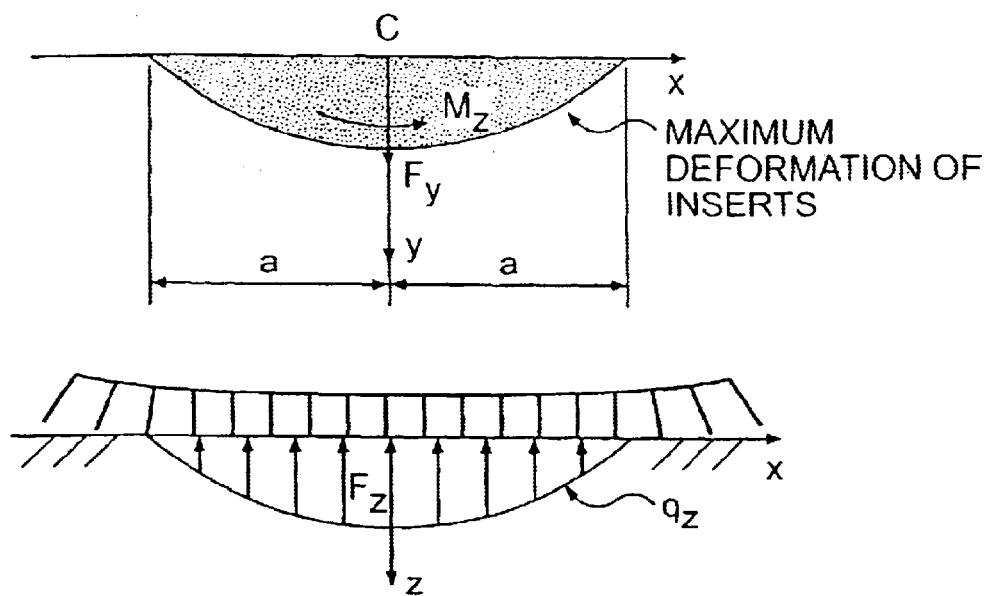

The non-linearity of the brush model results from the possibility of whether the microinserts slip or not. Two factors have a fundamental role in this: the coefficient of friction at the interface between the wheel and ground and the pressure distribution. A side view is shown of the reference model, at the bottom of FIG. 36. The pressure distribution is assumed to be parabolic in the longitudinal direction, whereas no pattern need be defined for the transverse direction since the brush model considered is monodimensional.

The normal forces per unit of length that are discharged to the ground are:

$$q_{z\_i} = \frac{3 \cdot F_z}{4 \cdot a} \cdot \left\{1 - \left(\frac{x_i}{a}\right)^6\right\} \cdot \Delta x \qquad (1.70)$$

where $F_z$ is the vertical load applied to the tyre. The maximum deformation possible for the generic microinsert is:

$$y_{i\_max} = \frac{3 \cdot F_z \cdot \mu}{4 \cdot c_p \cdot \Delta x} \cdot \left(\frac{a^2 - x_i^2}{a^3}\right) \qquad (1.71)$$

where $\mu$ is the coefficient of friction between tyre and ground and $c_{py}$ is the stiffness per unit of length of the brush model. When this maximum deformation is brought onto the line x representing the top ends of the microinserts, the area within which the bottom ends must fall is determined (seen from above, top part of FIG. 36).

Knowing the position of the top end and the bottom end of the generic microinsert, its deformation can be determined.

When the deformation of the microinserts and the stiffness of the tread are known, it is possible to determine the forces created under the contact area in the Y direction.

The resulting sideward force $F_{by}$ acting on the plate is:

$$F_{by}(t) = \sum_{i=1}^{n} (Y_{i\_T}(x_i, t) - Y_{i\_P}(x_i, t)) \cdot c_p \cdot \Delta x \qquad (1.72)$$

If the single sideward forces created under each single microinsert are integrated and multiplied by the respective arm, the self-aligning torque $M_{bz}$ is found as follows:

$$M_{bz}(t) = \sum_{i=1}^{n} (Y_{i\_T}(x_i, t) - Y_{i\_P}(x_i, t)) \cdot c_p \cdot \Delta x \cdot x_i \qquad (1.73)$$

Some results obtained for a rolling tyre from the procedure described are illustrated below.

To simulate the behaviour of the tyre in the transient state, a test was conducted envisaging a step input of the steering angle imparted to the hub. This test is particularly important as it serves to evaluate the time taken by the tyre to go into a steady state and therefore, in practice, it gives its speed of response.

In this test, a selected steering angle is imposed instantaneously on the hub at a time t=0 and the dynamic behaviour of the tyre is obtained from the time history of the six free degrees of freedom of the model, of the sideward force and of the self-aligning torque.

The test was conducted on a range 55 tyre with an applied vertical load of 2,914 N and a steering angle of four degrees imposed on the hub. The feed speed of the tyre was 30 Km/h.

Figure 37:
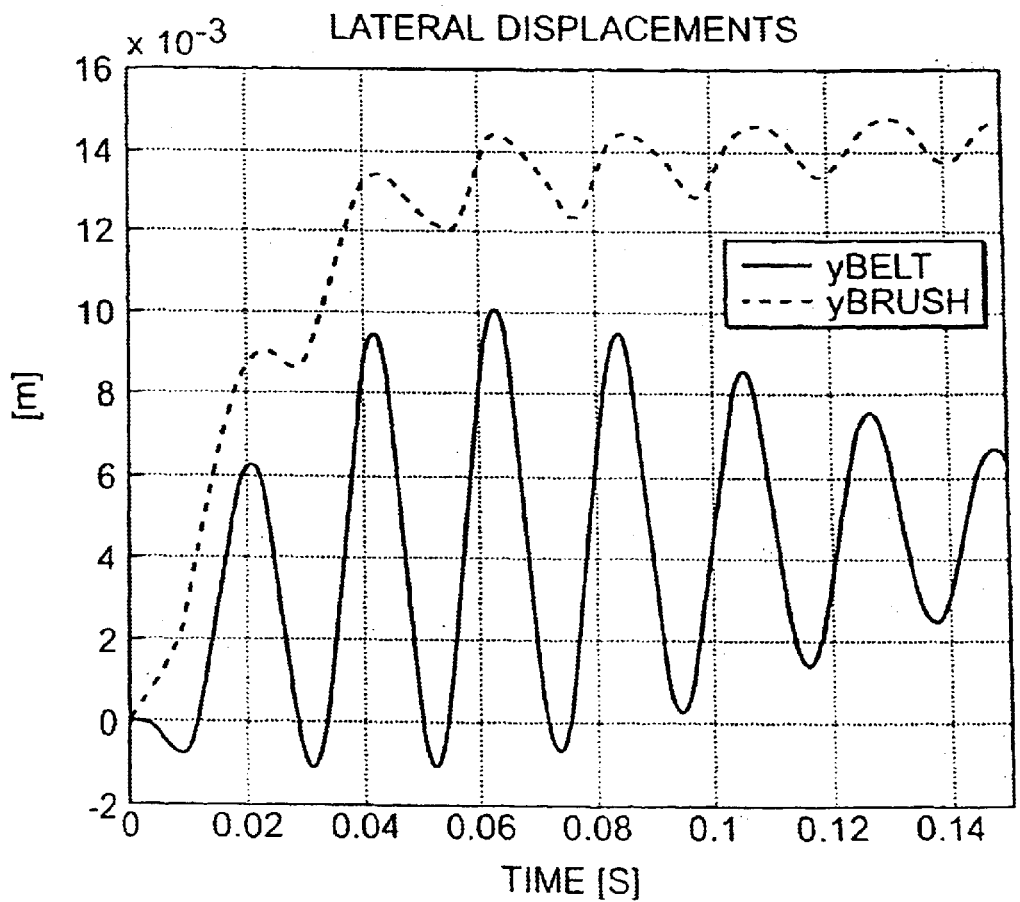
FIGS. 37–52 illustrate the drift transient state test results obtained from the concentrated-parameter physical model describing the selected real tyre.

FIG. 37 shows the time pattern of the lateral displacement of the belt $y_c$ with respect to the hub and of the absolute lateral displacement of the plate $y_b$.

Figure 38:
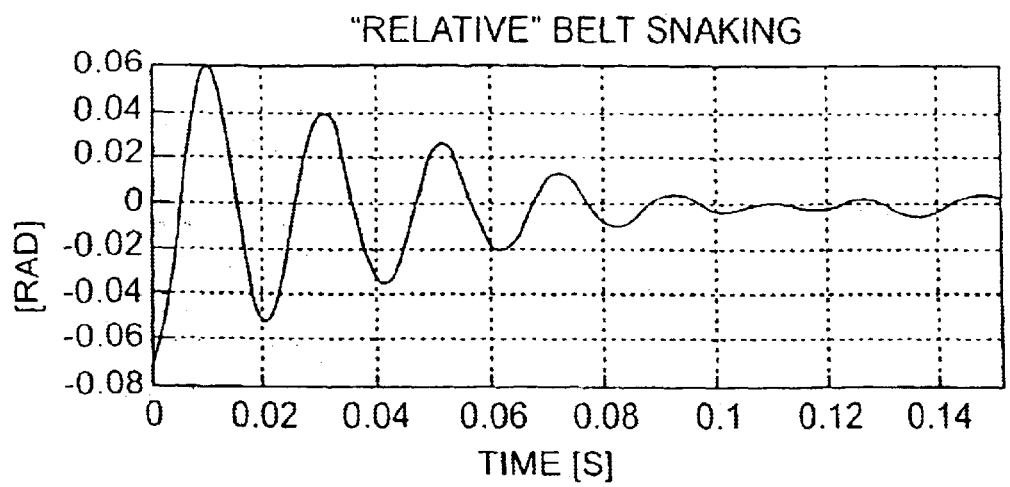
Figure 39:
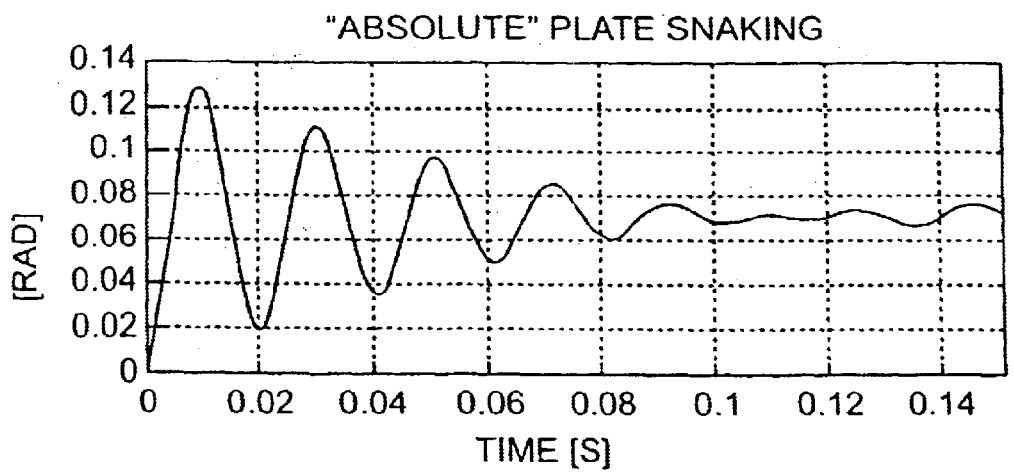
Figure 40:
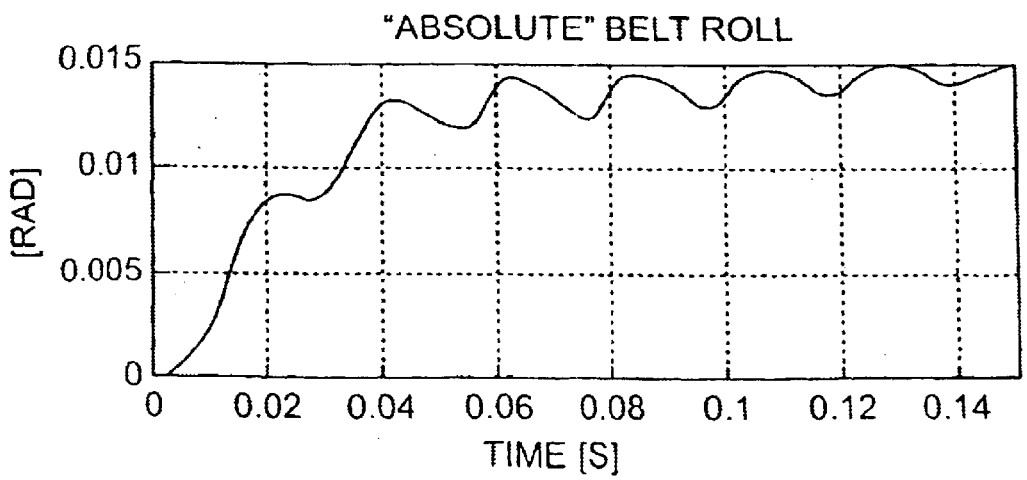

In FIGS. 38, 39 and 40, the time pattern is shown respectively of the snaking $\sigma_c$ of the belt, of the snaking $\sigma_b$ of the plate and of the roll $\rho_c$ of the belt.

Figure 41:
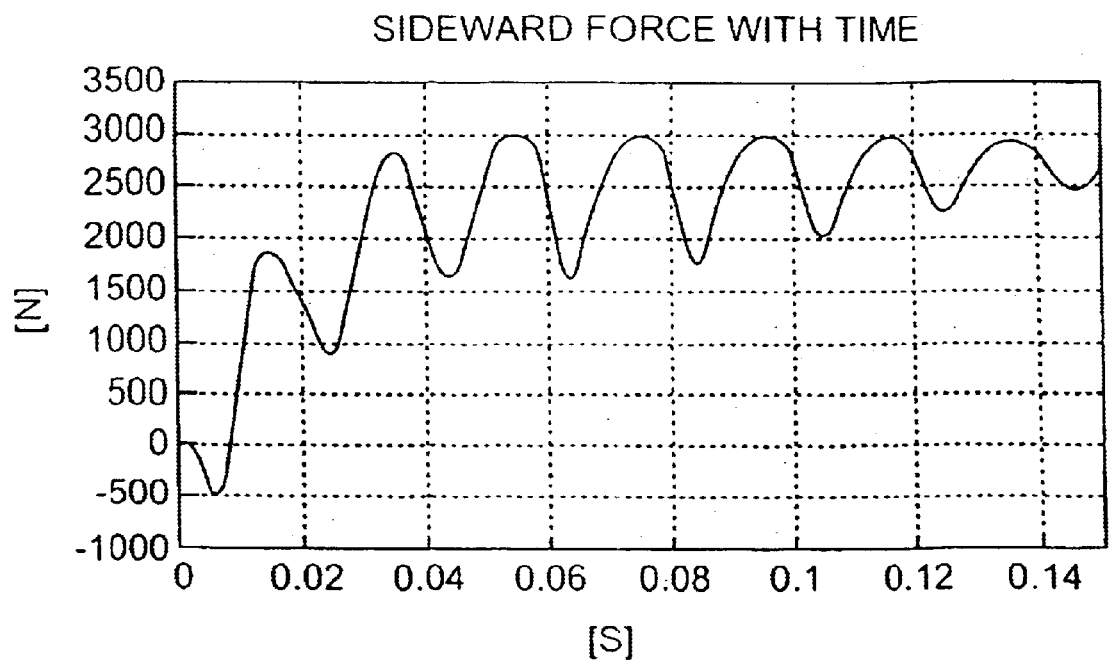
Figure 42:
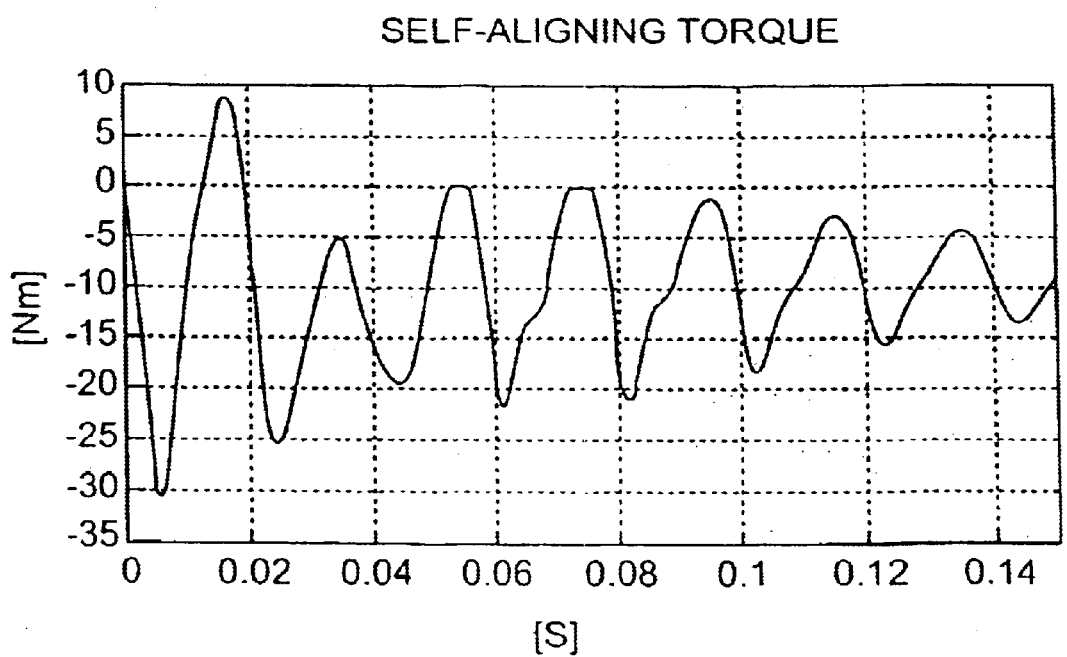

FIGS. 41 and 42 illustrate the time pattern respectively of the sideward force $F_{by}$ and of the self-aligning torque $M_{bz}$.

The pattern of the sideward force $F_{by}$ is used to evaluate the length of relaxation which consists of the space travelled by the tyre before the sideward force reaches 63.2% of its steady state value.

The behaviour of the tyre in drifting in the transient state is reproduced using, as the transversal drift force applied to the vehicle $F_{by}$, that given by the following equation:

$$\frac{\sigma}{V} \cdot \dot{F}_{by} + F_{by} = \overline{F}_{by}(\alpha) \qquad (1.74)$$

where $\alpha$ is the instantaneous drift angle, $F_{by}$ is the steady state force and $\delta$ is the length of relaxation.

Figure 43:
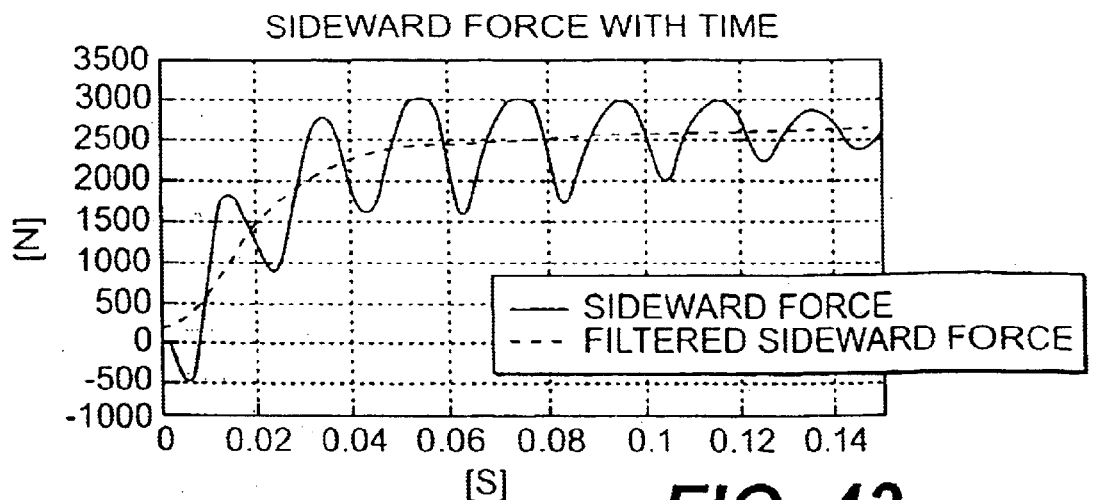

In order to determine the length of relaxation, the signal of the sideward force $F_{by}$ is removed of its high frequency harmonics. A low-pass filter was used with cut-off frequency 30 Hz (FIG. 43). The filtered signal is comparable to the response of a $1^{st}$ order system receiving a step signal as its input.

The general equation of motion of such a system is as follows:

$$A \cdot \frac{dF}{dt} + B \cdot F = F_{external} \qquad (1.75)$$

which, through the Laplace transform, may be written as follows:

$$\frac{F}{F_{external}} = \frac{1}{A \cdot s + B} = \frac{\frac{1}{B}}{\frac{A}{B} \cdot s + 1} = \frac{a}{\tau \cdot s + 1} \qquad (1.76)$$

where $\tau$ is the time constant of the system and represents the time taken by the system to reach 63.2% of its steady state value. The (1.76) is the system transfer function. If a step of amplitude $x_0$ is provided as input, the system response in the frequency domain is as follows:

$$F(s) = \frac{x_0}{s} \cdot \frac{a}{\tau \cdot s + 1} \qquad (1.77)$$

and, on passing to the time domain, the following is obtained:

$$F(t) = a \cdot x_0 \cdot \left(1 - e^{-\frac{t}{\tau}}\right) \qquad (1.78)$$

The term $a*x_0$ is the steady state value of F.

When the equations (1.74) and (1.75) are compared, the length of relaxation is obtained from the curve of the filtered sideward force.

Figure 44:
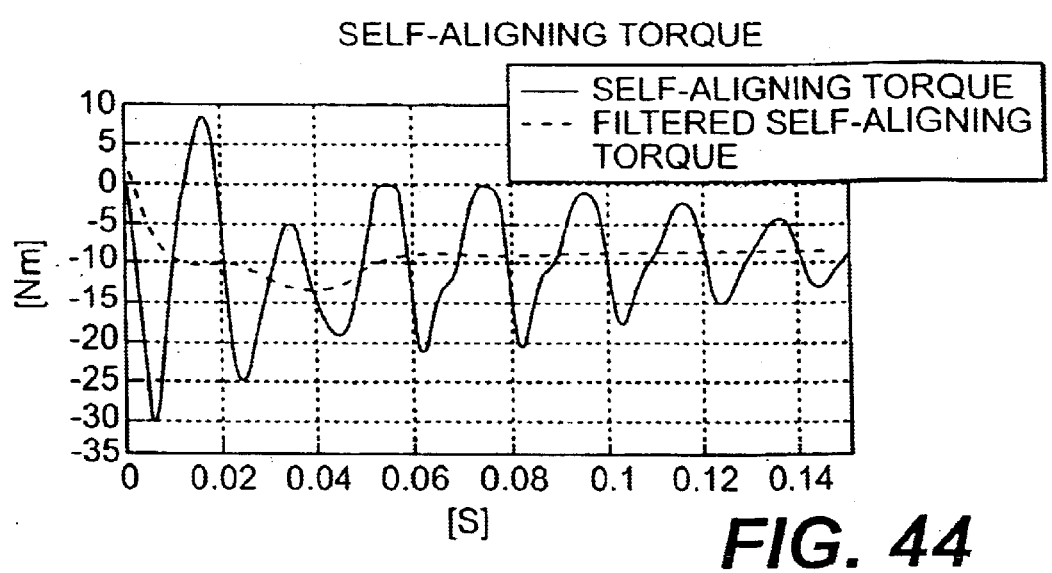

From the filtered signal of FIG. 43, the steady state value of the sideward force is obtained so as to calculate 63.2% and, from here, trace back to the time constant $\tau$. For an immediate evaluation of the steady state value, the same filtering operation was also carried out on the self-aligning torque (FIG. 44).

In the case in question, the relaxation length was found to be 0.23 meters.

Figure 45:
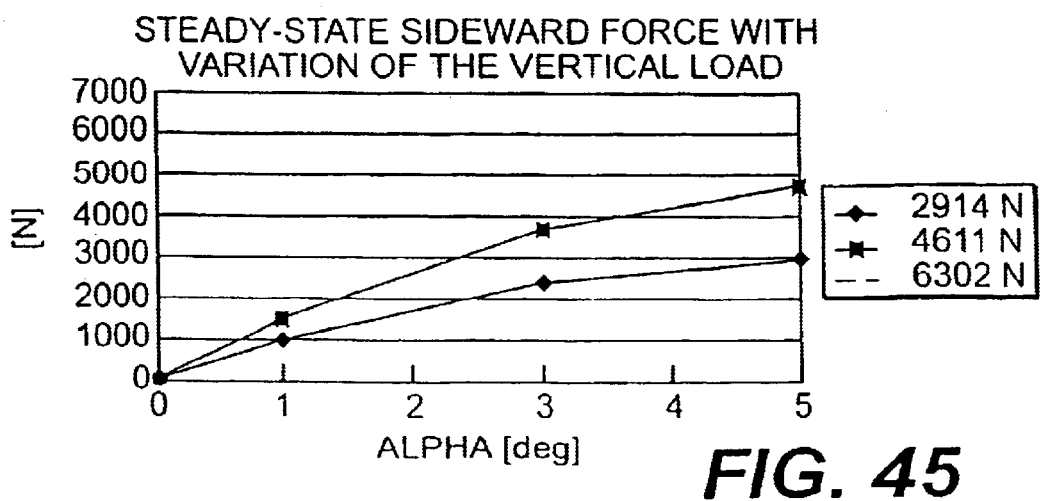
Figure 46:
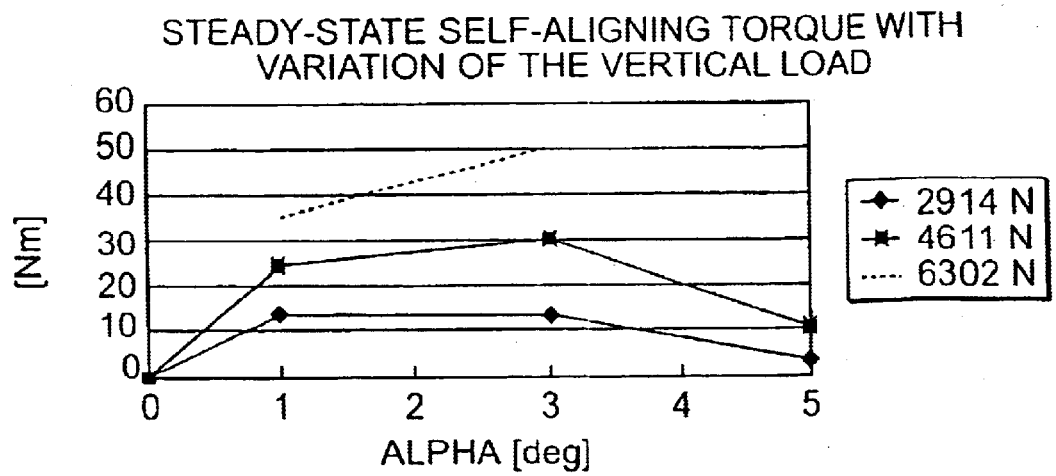
Figure 47:
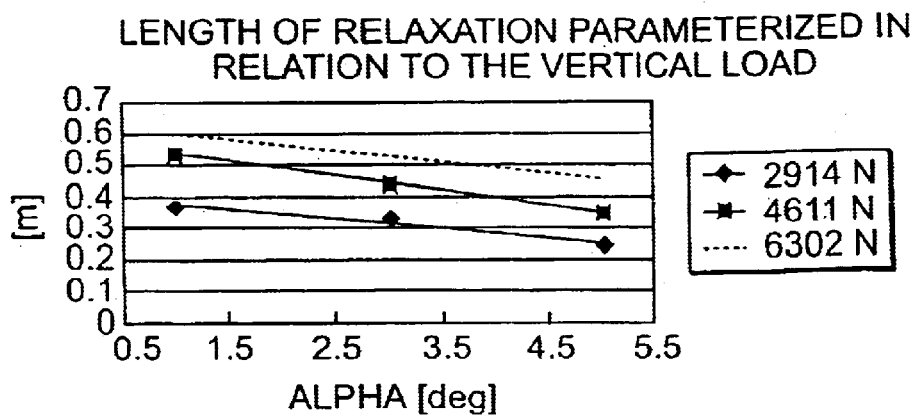

FIGS. 45–47 illustrate the results obtained with the range 55 tyre for three different loads and with different yaw angles imposed on the hub with feeding speed of 100 Km/h.

Figure 53:
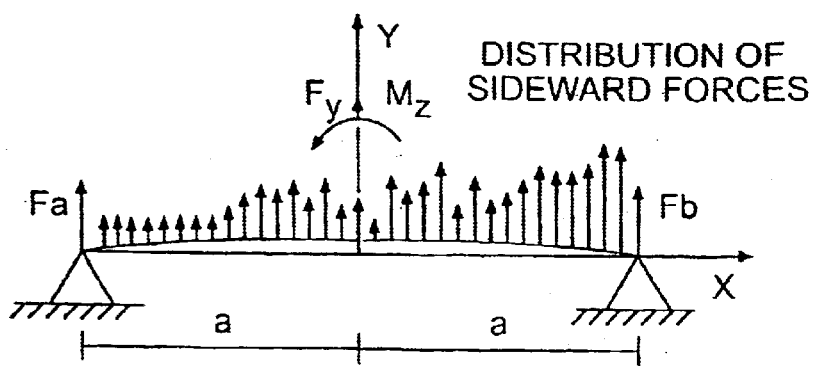
FIG. 53 depicts a distribution of forces acting on a beam of the tyre brush model.

Local deformability of the tyre in the transient state is also introduced into the brush model by means of the equivalent beam described above. After determining the deformation curve, the positions of the top ends of the microinserts are identified whereas the position of the bottom ends is determined using the procedure described above. On the basis of the data obtained, the single elementary forces acting on each section of a beam can be computed (FIG. 53).

The resulting sideward force and the self-aligning torque are determined by integrating the forces $q_y$ distributed along the beam. The constraining reactions $F_a$ and $F_b$ are determined in order to give the deformation curve.

$$F_y = \int_{-a}^{a} q_y * dx \qquad (1.79)$$

$$M_z = \int_{-a}^{a} q_y * x * dx \qquad (1.80)$$

$$F_a = -\frac{F_y}{2} + \frac{M_z}{2*a} \qquad (1.81)$$

$$F_b = -\frac{F_y}{2} - \frac{M_z}{2*a} \qquad (1.82)$$

Curvature of the beam is related to the bending torque through the following equation:

$$EJ*y''(x) = +M_f(x) \qquad (1.83)$$

This equation is resolved by determining the bending torque in each section of the beam.

Figure 48:
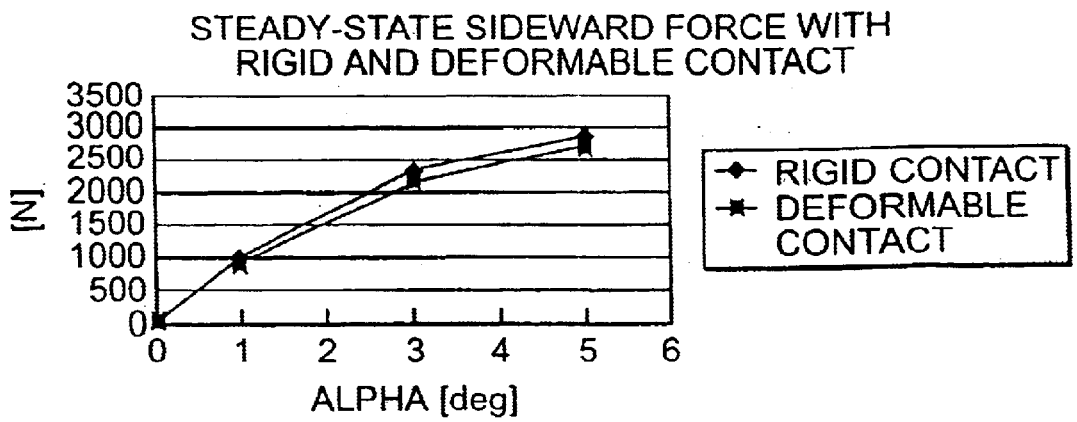
Figure 49:
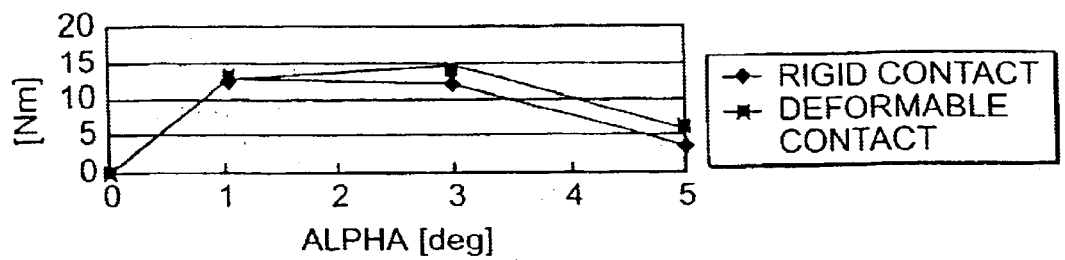
Figure 50:
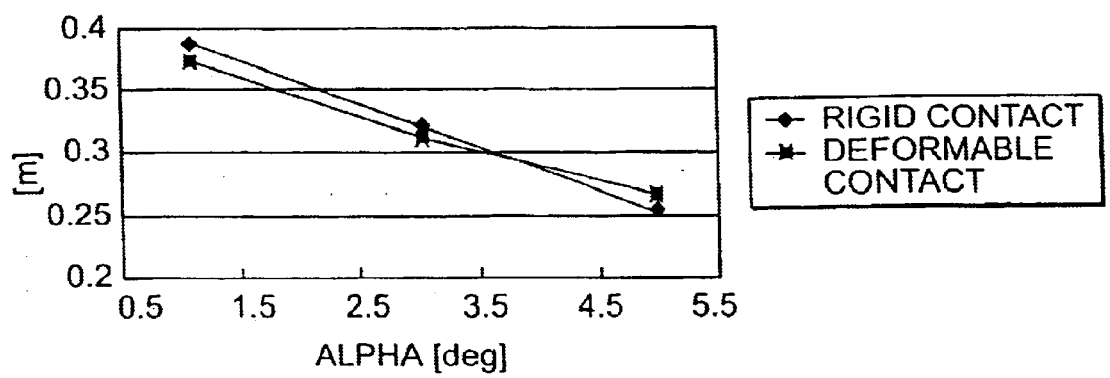

FIGS. 48, 49 and 50 illustrate the pattern respectively of the sideward force, of the self-aligning torque, of the length of relaxation at steady state in relation to the steering angle, with a rigid and deformable contact, for the range 55 tyre to which a vertical load of 2,914 N is applied.

Figure 51:
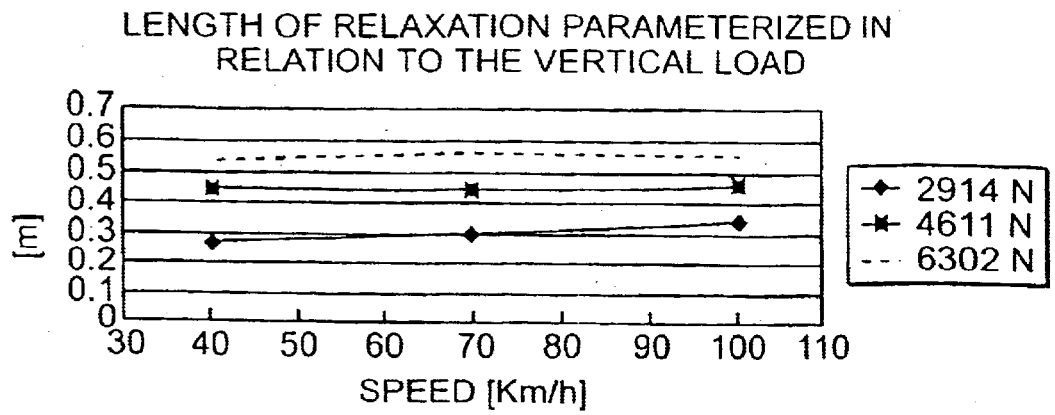
Figure 52:
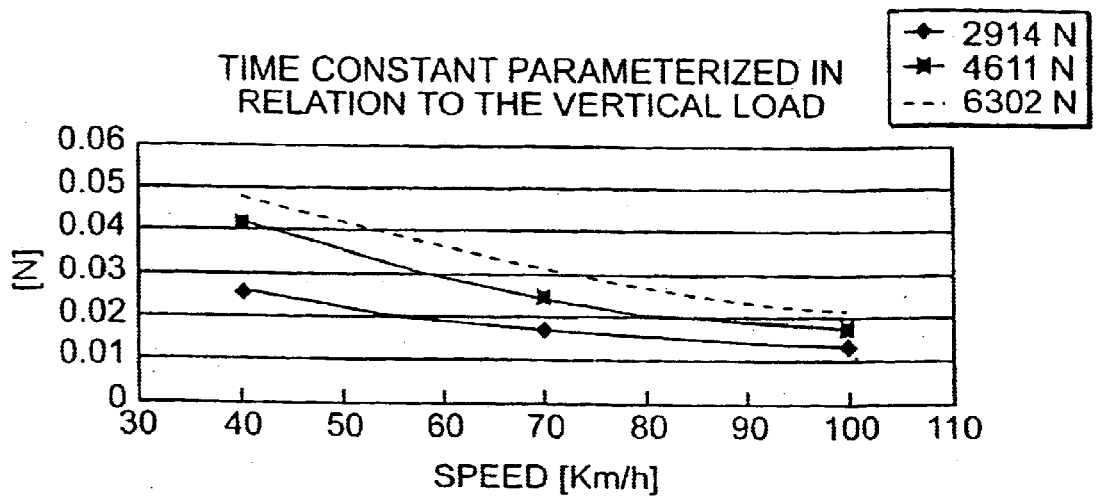

FIGS. 51 and 52 illustrate respectively the pattern of the length of relaxation and of the time constant in relation to velocity for the range 55 tyre to which three vertical loads of 2,914 N, 4,611 N and 6,302 N were applied.

What is claimed is:

1. Tire for a wheel of a vehicle, comprising:
   selected mixes of rubber and reinforcing materials;
   a carcass, a belting structure, a tread band provided with inserts, shoulders, sidewalls, and beads provided with bead wires and bead fillings;
   said tire being represented by a concentrated-parameter, physical model including a brush model with a road, wherein concentrated parameters of the physical model include structural stiffness $K_c$ consisting of lateral stiffness $K_{cy}$, camber torsional stiffness $K_{c\theta x}$ and yawing torsional stiffness $K_{c\theta z}$, structural dampings $R_c$ consisting of lateral damping $R_{cy}$, camber torsional damping $R_{c\theta x}$ and yawing torsional damping $R_{c\theta z}$, residual stiffness $K_r$ consisting of residual lateral stiffness $K_{ry}$, residual camber torsional stiffness $K_{r\theta x}$ and residual yawing torsional stiffness $K_{r\theta z}$, and residual dampings $R_r$ consisting of residual lateral damping $R_{ry}$, residual camber torsional damping $R_{r\theta x}$ and residual yawing torsional damping $R_{r\theta z}$; and
   said tire also being represented by means of a finite-element model comprising first elements with a selected number of nodes, suitable for describing said mixes, and second elements suitable for describing said reinforcing materials, said concentrated parameters being identified by a selected series of dynamic tests on said finite-element model and represented by equations of applied motion applied to said physical model, said tire having construction characteristics substantially equivalent to said concentrated parameters that describe the dynamic behavior of said tire and enable the determination of selected physical quantities suitable for indicating the drift behavior of said tire for evaluation of said tire in relation to its road handling.

2. Tire according to claim 1, wherein said selected physical quantities are the total drift stiffness $K_d$ of said tire, which comprises the structural stiffness $K_c$ and the tread stiffness $K_b$, and a total camber stiffness Ky of said tire.

3. Tire according to claim 2, wherein the total drift stiffness $K_d$ and the total camber stiffness Ky are within the following ranges:

$K_d$=500 to 2,000 N/g

Ky=40 to 3,500 N/g, where g=degree.

4. Tire according to claim 2, wherein the structural stiffness $K_c$ and the tread stiffness $K_b$ are within the following value ranges:

$K_c$=8,000 to 30,000 N/g $K_b$=150 to 400 N/g, where g=degree.

* * * * *